(12) United States Patent
Yamaguchi

(10) Patent No.: US 9,184,225 B1
(45) Date of Patent: *Nov. 10, 2015

(54) DISPLAY UNIT

(71) Applicant: Sony Corporation, Tokyo (JP)

(72) Inventor: Masaru Yamaguchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/807,340

(22) Filed: Jul. 23, 2015

Related U.S. Application Data

(60) Continuation of application No. 14/572,109, filed on Dec. 16, 2014, which is a continuation of application No. 14/454,261, filed on Aug. 7, 2014, which is a continuation of application No. 11/870,226, filed on Oct. 10, 2007, now Pat. No. 8,828,477, which is a division of application No. 10/840,074, filed on May 6, 2004, now Pat. No. 7,303,635.

(30) Foreign Application Priority Data

May 12, 2003 (JP) .................................. 2003-132791

(51) Int. Cl.
*H01L 27/00* (2006.01)
*H01L 27/32* (2006.01)
*H01L 51/52* (2006.01)
*H01L 51/00* (2006.01)

(52) U.S. Cl.
CPC ........ *H01L 27/3276* (2013.01); *H01L 27/3211* (2013.01); *H01L 51/0035* (2013.01); *H01L 51/5221* (2013.01); *H01L 51/5253* (2013.01); *H01L 2251/301* (2013.01); *H01L 2251/303* (2013.01); *H01L 2251/558* (2013.01)

(58) Field of Classification Search
None
See application file for complete search history.

(56) References Cited

U.S. PATENT DOCUMENTS

| | | | |
|---|---|---|---|
| 4,976,988 A | 12/1990 | Honda | |
| 6,255,775 B1 | 7/2001 | Ikuko et al. | |
| 6,781,162 B2 | 8/2004 | Yamazaki et al. | |
| 6,858,086 B2 | 2/2005 | Kang | |
| 6,869,635 B2 | 3/2005 | Kobayashi et al. | |
| 7,402,948 B2 | 7/2008 | Yamazaki et al. | |
| 8,970,105 B2 * | 3/2015 | Yamaguchi | C23C 14/042 313/504 |
| 2001/0026125 A1 | 10/2001 | Yamazaki et al. | |

(Continued)

FOREIGN PATENT DOCUMENTS

| | | |
|---|---|---|
| EP | 1 274 130 | 1/2003 |
| EP | 1 441 572 | 7/2004 |

(Continued)

OTHER PUBLICATIONS

Derwent Abstract of KR2003027168A, 2003.*

*Primary Examiner* — Robert Vetere
(74) *Attorney, Agent, or Firm* — K&L Gates LLP

(57) ABSTRACT

A display unit is provided including a first insulating film, a plurality of anode electrodes disposed on the first insulating film, a second insulating film disposed on the anode electrodes, a plurality of organic layers disposed on the anode electrodes, a cathode electrode disposed on the organic layer, and a first wiring disposed on the first insulating film. The cathode electrode is connected to an extraction electrode via a first wiring provided in a peripheral area of the anode electrodes. Moreover, one of the organic layers extending in a column direction is provided over two of more rows of the anode electrodes.

23 Claims, 35 Drawing Sheets

(56) References Cited

U.S. PATENT DOCUMENTS

| 2002/0187265 | A1 | 12/2002 | Mori et al. |
| 2003/0107314 | A1 | 6/2003 | Urabe et al. |
| 2003/0184217 | A1 | 10/2003 | Yamazaki et al. |
| 2003/0222575 | A1 | 12/2003 | Yamazaki et al. |
| 2004/0004430 | A1* | 1/2004 | Hamada .............. H01L 27/3272 313/498 |
| 2004/0168634 | A1 | 9/2004 | Mori et al. |
| 2005/0077814 | A1 | 4/2005 | Koo et al. |

FOREIGN PATENT DOCUMENTS

| JP | 2000-113980 | 4/2000 |
| JP | 2000-331783 | 11/2000 |
| JP | 2001-230086 | 8/2001 |
| JP | 2001-195008 | 9/2001 |
| JP | 2001-296819 | 10/2001 |
| JP | 2003-022892 | 1/2003 |
| KR | 20030027168 | 4/2003 |
| WO | 0163975 | 8/2001 |

* cited by examiner

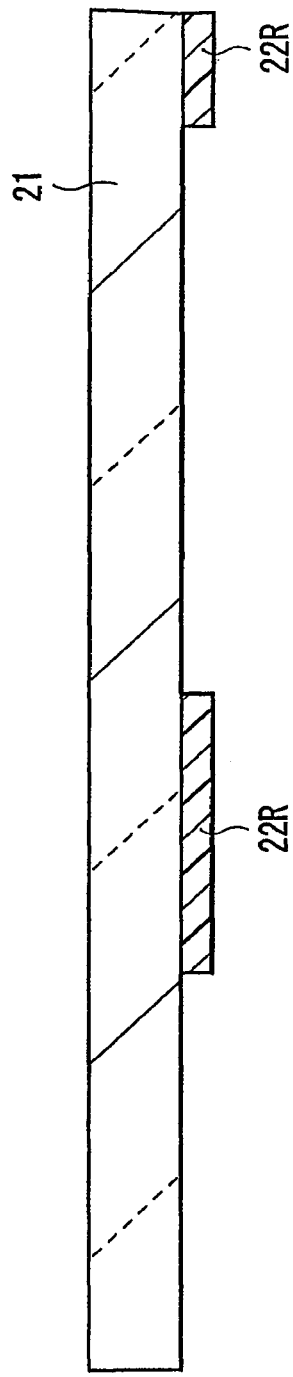
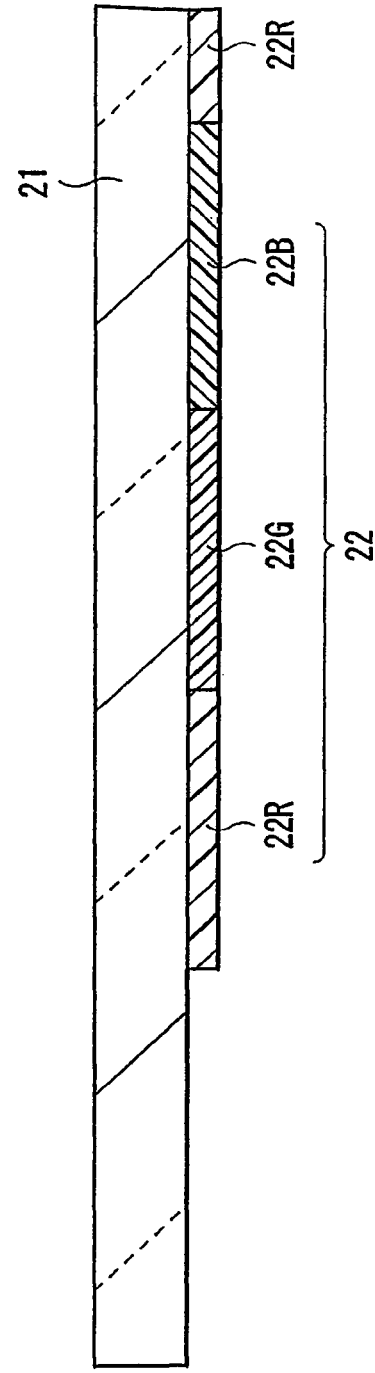
FIG. 31A
FIG. 31B

DISPLAY UNIT

CROSS REFERENCES TO RELATED APPLICATIONS

The present application is a continuation of U.S. patent application Ser. No. 14/572,109, filed Dec. 16, 2014, which is a continuation of U.S. patent application Ser. No. 14/454,261, filed Aug. 7, 2014, which application is a continuation of U.S. patent application Ser. No. 11/870,226, filed on Oct. 10, 2007, issued as U.S. Pat. No. 8,828,477 on Sep. 9, 2014, which is a divisional of U.S. patent application Ser. No. 10/840,074 filed on May 6, 2004, issued as U.S. Pat. No. 7,303,635 on Dec. 4, 2007, and claims priority to Japanese Patent Application No. JP2003-132791, filed on May 12, 2003, the disclosure of which is herein incorporated by reference.

BACKGROUND

The present invention relates to a deposition mask, a method for manufacturing a display unit using same, and a display unit. More specifically the present invention relates to a deposition mask suitable for manufacturing a display unit using organic light emitting devices, a method for manufacturing a display unit using same, and a display unit.

In recent years, as a display unit instead of a liquid crystal display, an organic light emitting display which uses organic light emitting devices has been used. The organic light emitting display has characteristics that its viewing angle is wide and its power consumption is low since it is a self-luminous type display. The organic light emitting display is also thought of as a display having sufficient response to high-definition high-speed video signals, and is under development toward the practical use.

A conventional organic light emitting display is manufactured through processes of FIGS. 1 to 7. First, as shown in FIG. 1, a number of first electrodes 114 are formed on a substrate 111. These first electrodes 114 are patterned for respective organic light emitting devices, and electrically connected to unshown TFTs (Thin Film Transistor) which are provided corresponding to respective organic light emitting devices with an unshown planarizing layer in between.

Next, as shown in FIG. 2, an insulating film 115 is formed in an area between the number of first electrodes 114. This insulating film 115 is provided with openings 115A corresponding to the first electrodes 114.

Subsequently, as shown in FIG. 3, an auxiliary electrode 116A is formed at the position corresponding to the inside of picture on the insulating film 115, and a trunk-shaped auxiliary electrode 116B which becomes a bus line for the auxiliary electrode 116A is formed in a peripheral area of the substrate 111. The auxiliary electrode 116A is provided in order to uniform a wiring resistance between a power source (not shown) and respective light emitting parts, and inhibit generation of emission unevenness due to difference of voltage drop (particularly emission unevenness between a central part and a peripheral part inside the picture). Further, on an end of the trunk-shaped auxiliary electrode 116B, an extraction electrode 116C is provided in order to connect a second electrode 116 to the power source.

After that, for example, an organic layer 117 of an organic light emitting device 110G generating green light is formed as shown in FIG. 5, by using a deposition mask 140 having openings 141 corresponding to respective organic light emitting devices as shown in FIG. 4.

Next, as shown in FIG. 6, an organic layer 117 of an organic light emitting device 110R generating red light is formed by moving the deposition mask 140, and as shown in FIG. 5, an organic layer 117 of an organic light emitting device 110B generating blue light is similarly formed by moving the deposition mask 140 again.

Subsequently, as shown in FIG. 7, the second electrode 116 is formed almost over the whole area of the substrate 111 by deposition method. The second electrode 116 and the auxiliary electrode 116A are thereby electrically connected at a contact part 118.

Conventionally, for example, a case wherein a rib which serves as a spacer for a deposition mask to form an organic layer is provided between respective organic light emitting devices, and an auxiliary electrode is formed on this rib has been proposed. See, for example, Japanese Unexamined Patent Application Publication No. 2001-195008.

In the conventional deposition mask 140, the openings 141 are provided corresponding to respective organic light emitting devices (FIG. 4). When deposition is performed by using such a deposition mask 140, a film thickness distribution may be generated in the organic layer 117 depending on conditions of deposition from an evaporation source 152, as shown in FIG. 8. Such a film thickness distribution varies depending on a plate thickness or a cross sectional shape of the deposition mask 140, or a physical relation between the evaporation source 152 and the openings 141 of the deposition mask 140. In particular, the film thickness distribution is subject to influence by characteristics of the evaporation source 152. Light emitting colors, that is, light emitting wavelengths of the organic light emitting devices depend on a film thickness of the organic layer 117. Therefore, in order to prevent color unevenness inside pixels, it is necessary to utilize only the area in the vicinity of the center of the organic layer 117 having an even film thickness as an effective light emitting region 117A. Therefore, there has been a problem that when using the conventional deposition mask 140, the effective light emitting region 117A is limited, so that an aperture ratio is lowered.

SUMMARY

The present invention relates to a deposition mask, a method for manufacturing a display unit using same, and a display unit. More specifically the present invention relates to a deposition mask suitable for manufacturing a display unit using organic light emitting devices, a method for manufacturing a display unit using same, and a display unit.

In an embodiment, the present invention provides a deposition mask which can improve an aperture ratio of a display unit, and a method for manufacturing a display unit using the deposition mask.

In another embodiment, the present invention provides a display unit which is manufactured by using the deposition mask of the invention, and whose aperture ratio is improved.

The deposition mask according to an embodiment of the present invention is provided in order to form a continuous organic layer common to organic light emitting devices of a display unit which has a matrix configuration constructed by a number of lines and columns of the number of organic light emitting devices on a substrate by deposition method. The deposition mask according to an embodiment of the present invention includes a body part having one or more stripe-shaped openings to form a continuous organic layer common to at least two lines of the matrix configuration, and protrusions which are provided on the body part to partly protrude inside the opening.

The method for manufacturing a display unit according to an embodiment of the present invention is a method to manufacture a display unit having a matrix configuration constructed by a number of lines and columns of a number of organic light emitting devices on a substrate. The method for manufacturing a display unit according to an embodiment of to the present invention includes forming a number of first electrodes in the shape of a matrix corresponding to the respective number of organic light emitting devices on the substrate; forming an insulating film in an area between lines and columns of the number of first electrodes; forming an auxiliary electrode in an area between lines or columns of the number of first electrodes on the insulating film; forming a continuous organic layer common to at least two of the number of first electrodes in the shape of a stripe by deposition, and notch parts at a position corresponding to an area between lines of the first electrodes of the stripe-shaped continuous organic layer; and forming a second electrode covering almost a whole area of the substrate after the continuous organic layer having the notch parts is formed, a contact part is formed at the notch parts of the continuous organic layer, and electrically connecting the second electrode and the auxiliary electrode.

The display unit according to an embodiment of the present invention has a matrix configuration constructed by a number of lines and columns of a number of organic light emitting devices on a substrate. The display unit according to the invention comprises: a number of first electrodes provided on the substrate corresponding to the respective number of organic light emitting devices; an insulating film provided in an area between lines or columns of the number of first electrodes; an auxiliary electrode provided in an area between lines or columns of the number of first electrodes on the surface of the insulating film; a stripe-shaped continuous organic layer, which is provided over at least two lines of a matrix configuration of the number of organic light emitting devices in common on the surface of the substrate including the number of first electrodes, and which has notch parts on its side wall part corresponding to an area between lines of the number of first electrodes; and a second electrode, which covers almost a whole area of the substrate including the continuous organic layer, and which is electrically connected to the auxiliary electrode through a contact part formed at the notch parts of the continuous organic layer.

In the deposition mask according to an embodiment of the present invention, the continuous organic layer common to at least two lines of the matrix configuration constructed by the number of lines and columns of the number of organic light emitting devices is formed through the stripe-shaped opening provided on the body part of the deposition mask. Therefore, a film thickness distribution is decreased in the extensional direction of the continuous organic layer. Further, since the protrusions are provided to partly protrude inside the opening, the notch parts which become the contact part between the auxiliary electrode and the second electrode are formed on the continuous organic layer.

In the method for manufacturing the display unit according to an embodiment of the present invention, the number of first electrodes are formed on the substrate in the shape of a matrix corresponding to the respective number of organic light emitting devices. Next, after the insulating film is formed in the area between lines and columns of the number of first electrodes, the auxiliary electrode is formed on the insulating film. Subsequently, the continuous organic layer common to at least two of the number of first electrodes is formed in the shape of a stripe by deposition, and the notch parts are formed at the position corresponding to the area between lines of the first electrodes of the stripe-shaped continuous organic layer. After that, the second electrode covering almost the whole area of the substrate is formed, the contact part is formed at the notch parts of the continuous organic layer, and the second electrode and the auxiliary electrode are electrically connected.

In the display unit according to an embodiment of the present invention, the stripe-shaped continuous organic layer is provided over at least two lines of the matrix configuration of the number of organic light emitting elements in common. Therefore, a film thickness distribution is decreased in the extensional direction of the continuous organic layer. Further, the notch parts are provided on the side wall part of the continuous organic layer corresponding to the area between lines of the number of first electrodes, and the auxiliary electrode and the second electrode are electrically connected through the contact part formed at these notch parts. Therefore, a wiring resistance difference between the power source and respective organic light emitting devices is reduced.

In an embodiment, the present invention provides a deposition mask which can improve an aperture ratio of a display unit, a method for manufacturing a display unit using it, and a display unit. A red continuous organic layer, a green continuous organic layer, and a blue continuous organic layer are provided over two or more lines of a matrix configuration of organic light emitting devices in common. Differently from the conventional case wherein the organic layer is formed corresponding to each organic light emitting device, a film thickness distribution in the extensional direction of the red continuous organic layer, the green continuous organic layer, and the blue continuous organic layer is dissolved, and an aperture ratio can be improved by just that much. Notch parts are provided for the red continuous organic layer, the green continuous organic layer, and the blue continuous organic layer. At these notch parts, a contact part between a second electrode and an auxiliary electrode is formed. Therefore, voltage drop of the second electrode can be effectively inhibited.

Additional features and advantages of the present invention are described in, and will be apparent from, the following Detailed Description of the Invention and the figures.

BRIEF DESCRIPTION OF THE FIGURES

FIGS. 31A and 31B are cross sectional views regarding manufacturing processes following the process of FIG. 30.

DETAILED DESCRIPTION OF THE INVENTION

The present invention relates to a deposition mask, a method for manufacturing a display unit using same, and a display unit. More specifically the present invention relates to a deposition mask suitable for manufacturing a display unit using organic light emitting devices, a method for manufacturing a display unit using same, and a display unit.

An embodiment of the present invention will be described in detail hereinbelow with reference to the drawings.

Figure 1:
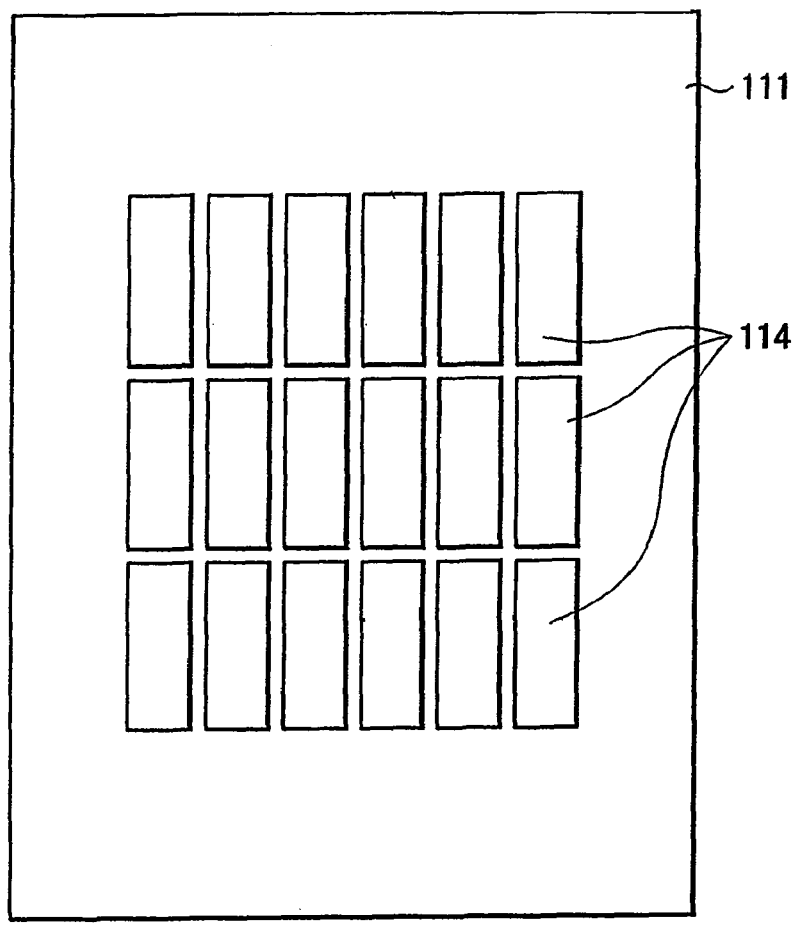
FIG. 1 is a plane view to explain a method for manufacturing a conventional display unit.
Figure 2:
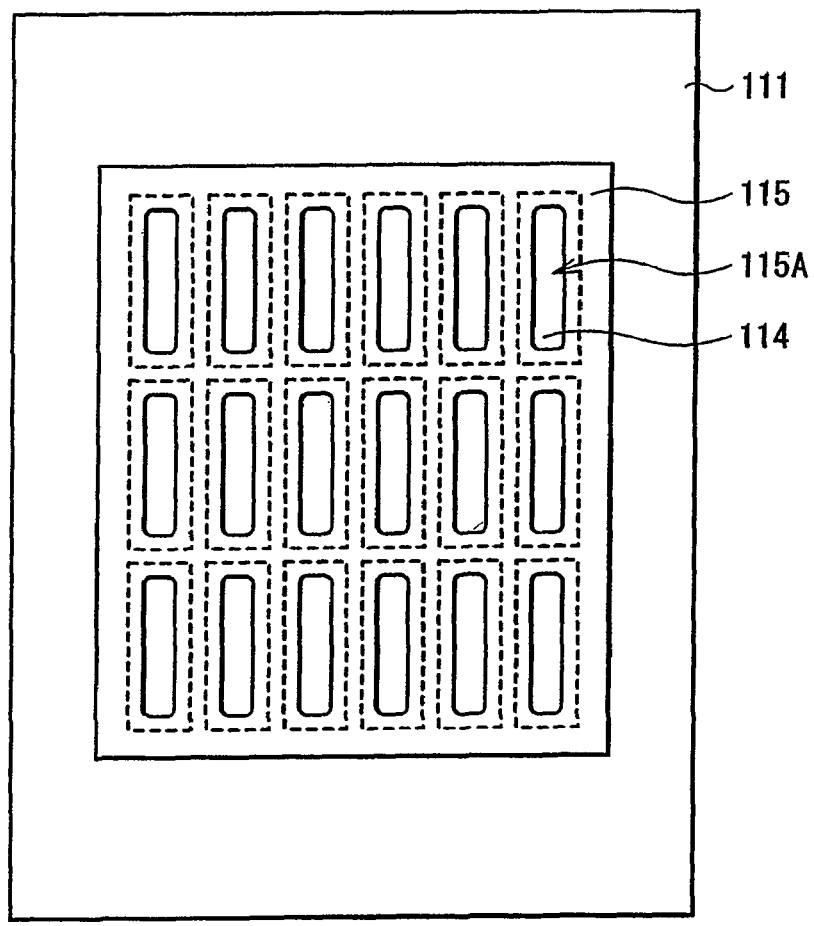
FIG. 2 is a plane view to explain a manufacturing process following a process of FIG. 1.
Figure 3:
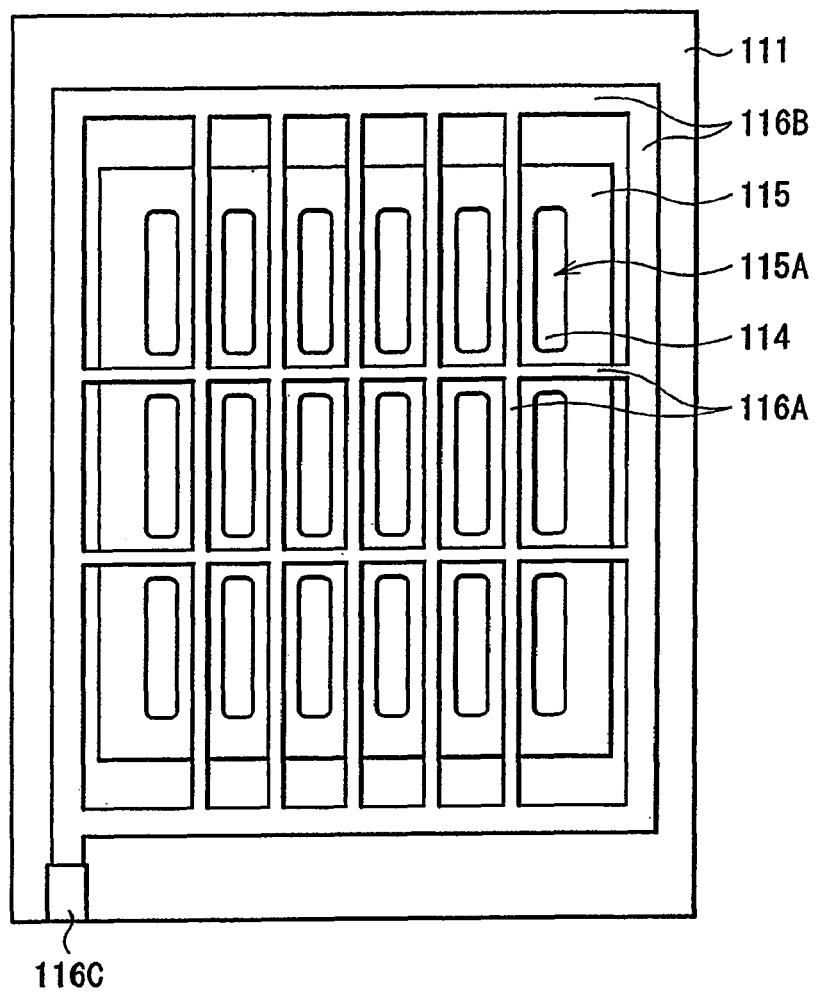
FIG. 3 is a plane view to explain a manufacturing process following the process of FIG. 2.
Figure 4:
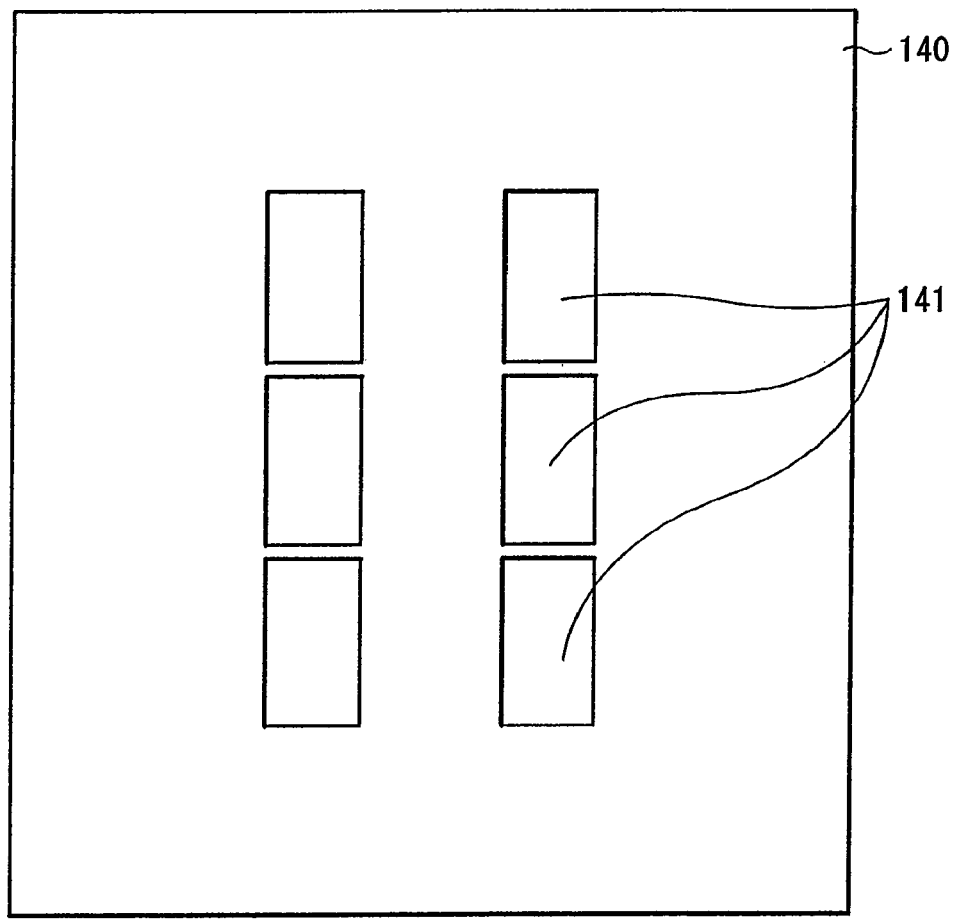
FIG. 4 is a plane view to explain a manufacturing process following the process of FIG. 3.
Figure 5:
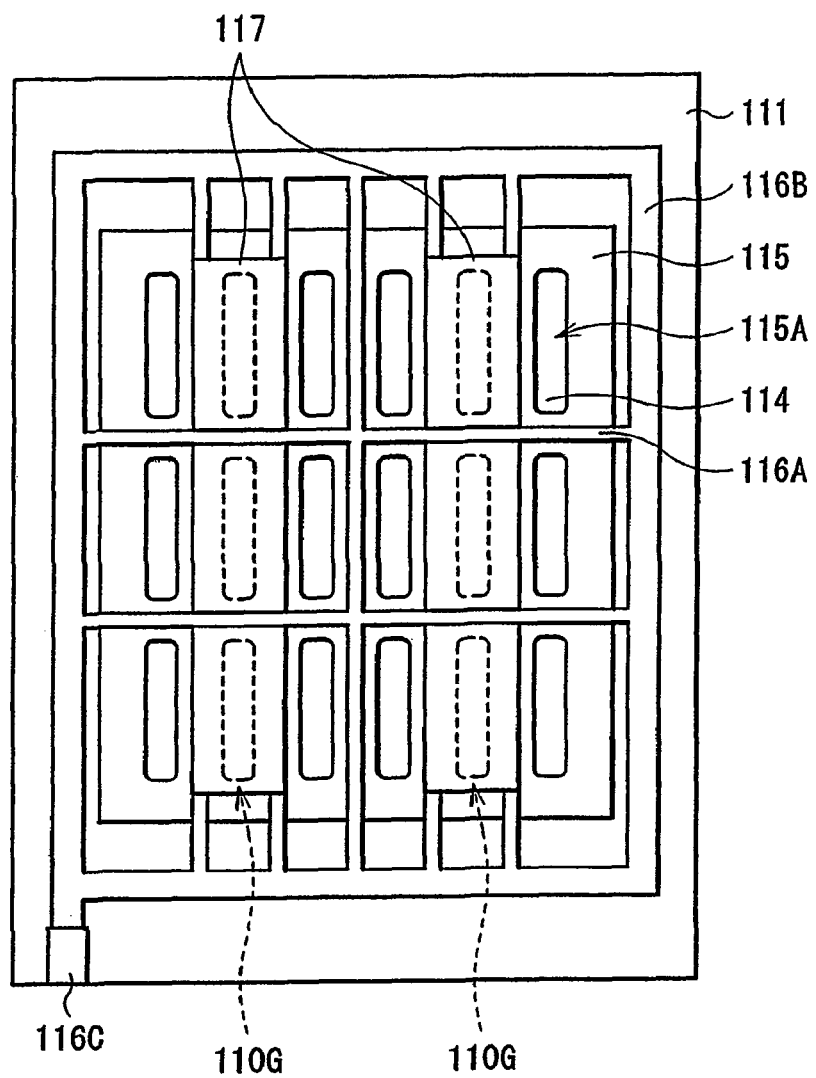
FIG. 5 is a plane view to explain a manufacturing process following the process of FIG. 4.
Figure 6:
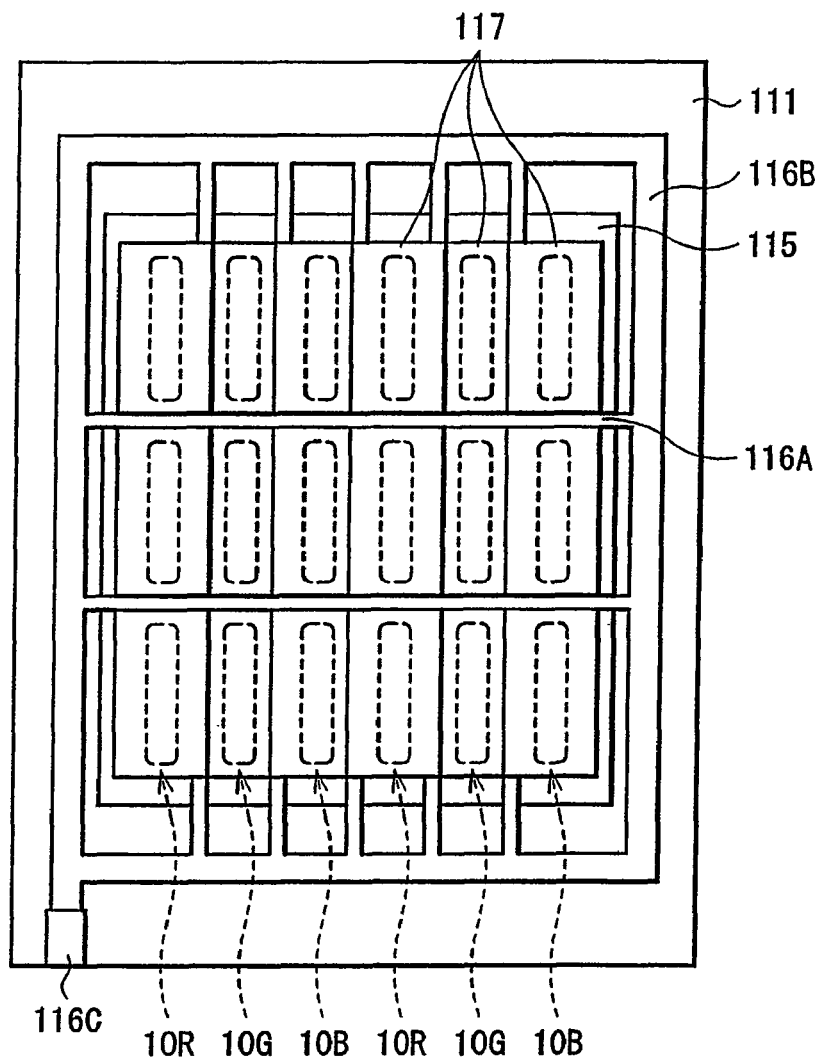
FIG. 6 is a plane view to explain a manufacturing process following the process of FIG. 5.
Figure 7:
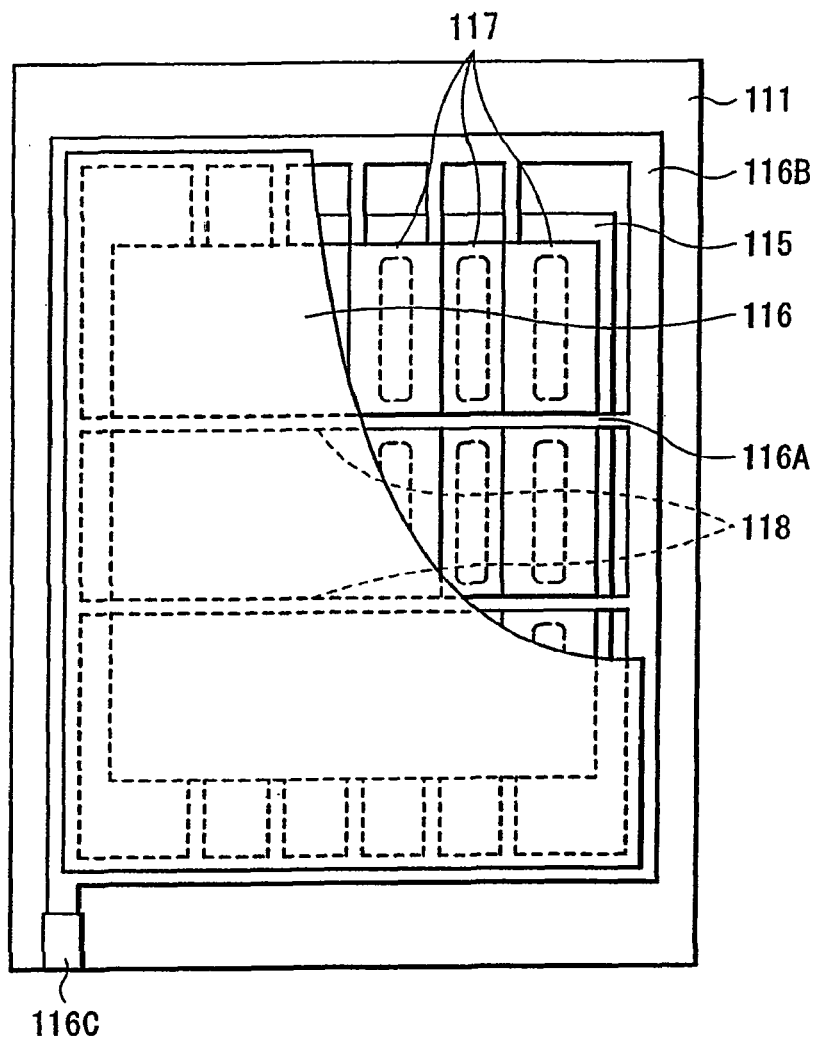
FIG. 7 is a plane view to explain a manufacturing process following the process of FIG. 6.
Figure 8:
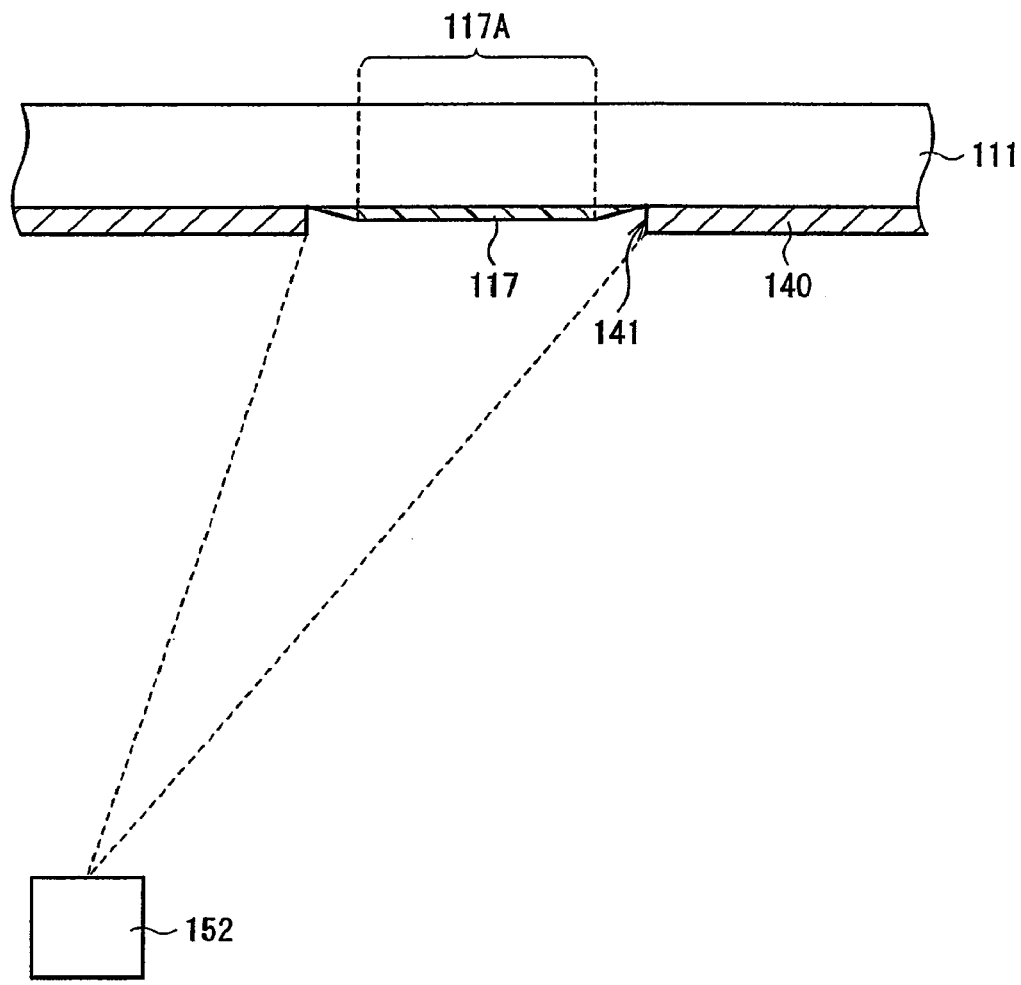
FIG. 8 is a cross sectional view to explain a problem area of a deposition mask used in manufacturing the conventional display unit.
Figure 9:
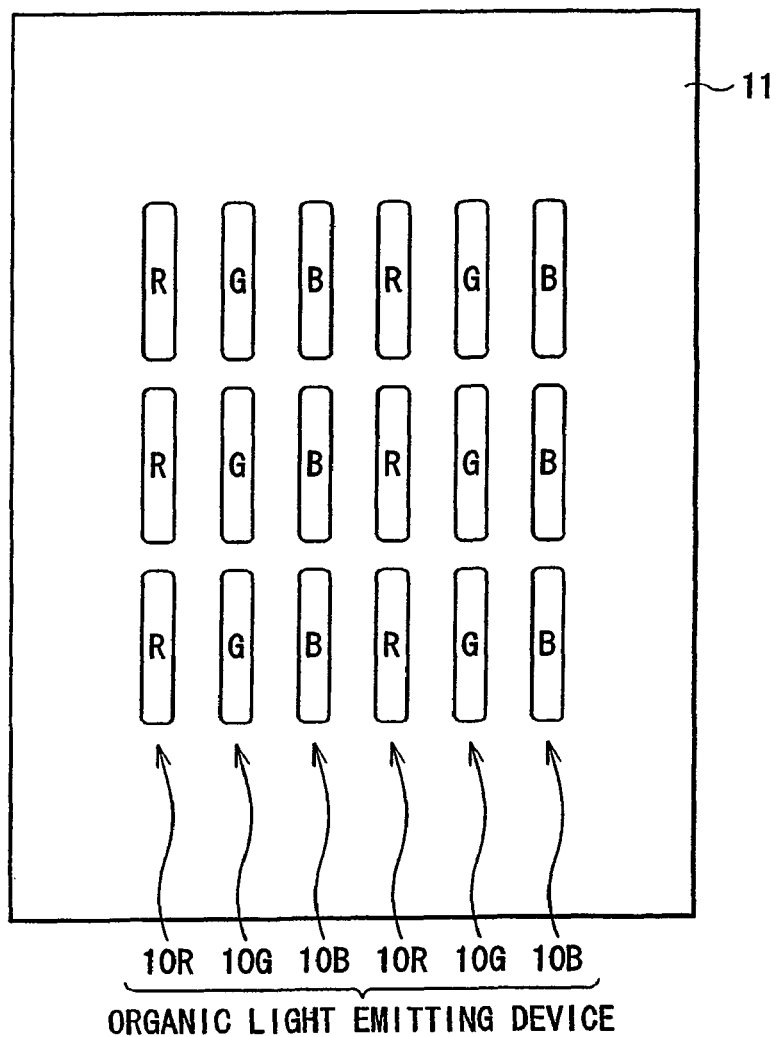
FIG. 9 is a plane view showing an outline construction of a display unit according to an embodiment of the present invention.

With reference to FIGS. 9 to 31B, a method for manufacturing a display unit according to an embodiment of the invention and a deposition mask used for the display unit will be described. This display unit is used, for example, as an ultra thin organic light emitting display. As shown in FIG. 9, many pixels are arranged in the shape of a matrix as a whole by constructing a matrix configuration constructed by a number of lines and columns of organic light emitting devices 10R, 10G, and 10B on a substrate 11, setting three primary colors device of the organic light emitting device 1 OR generating red light, the organic light emitting device 10G generating green light, and the organic light emitting device 10B generating blue light to one pixel unit.

Figure 10:
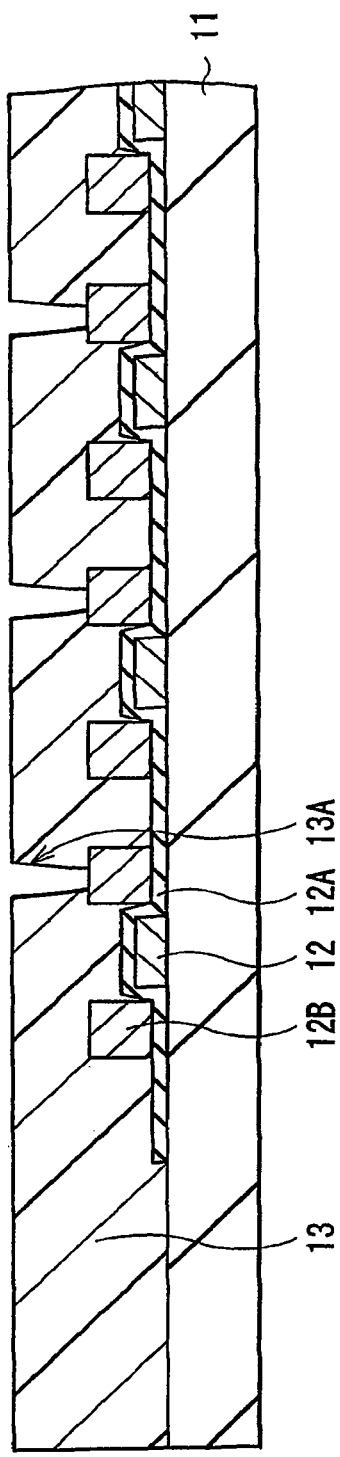
FIG. 10 is a cross sectional view to explain a manufacturing process of the display unit shown in FIG. 9.

In this embodiment, before such organic light emitting devices 10R, 10G, and 10B are formed, first, as shown in FIG. 10, a TFT 12 is formed on the substrate 11 made of an insulating material such as glass, then an interlayer insulating film 12A made of, for example, silicon oxide, PSG (Phospho-Silicate Glass) or the like is formed. After that, a wiring 12B made of, for example, aluminum (Al) or an aluminum (Al)-copper (Cu) alloy is formed as a signal line. A gate electrode (not shown) of the TFT 12 is connected to an unshown scanning circuit. A source and a drain (not shown either) are connected to the wiring 12B through an unshown contact hole provided on the interlayer insulating film 12A. A construction of the TFT 12 is not limited particularly, and can be either a bottom gate type or a top gate type, for example.

Next, as shown in FIG. 10 as well, a planarizing layer 13 made of an organic material such as polyimide is formed on the whole area of the substrate 11 by, for example, spin coat method. The planarizing layer 13 is patterned in a given shape by exposure and development, and a contact hole 13A is formed. The planarizing layer 13 is provided in order to planarize the surface of the substrate 11 wherein the TFT 12 is formed, and evenly form a film thickness in the direction of layers (hereinafter referred to as "thickness") of respective layers of the organic light emitting devices 10R, 10G, and 10B formed in a subsequent process. The planarizing layer 13 is preferably made of a material having a desirable pattern precision, since the fine contact hole 13A is formed. As a material for the planarizing layer 13, an inorganic material such as silicon oxide (SiO2) or the like can be used, instead of the organic material such as polyimide or the like.

Figure 11:
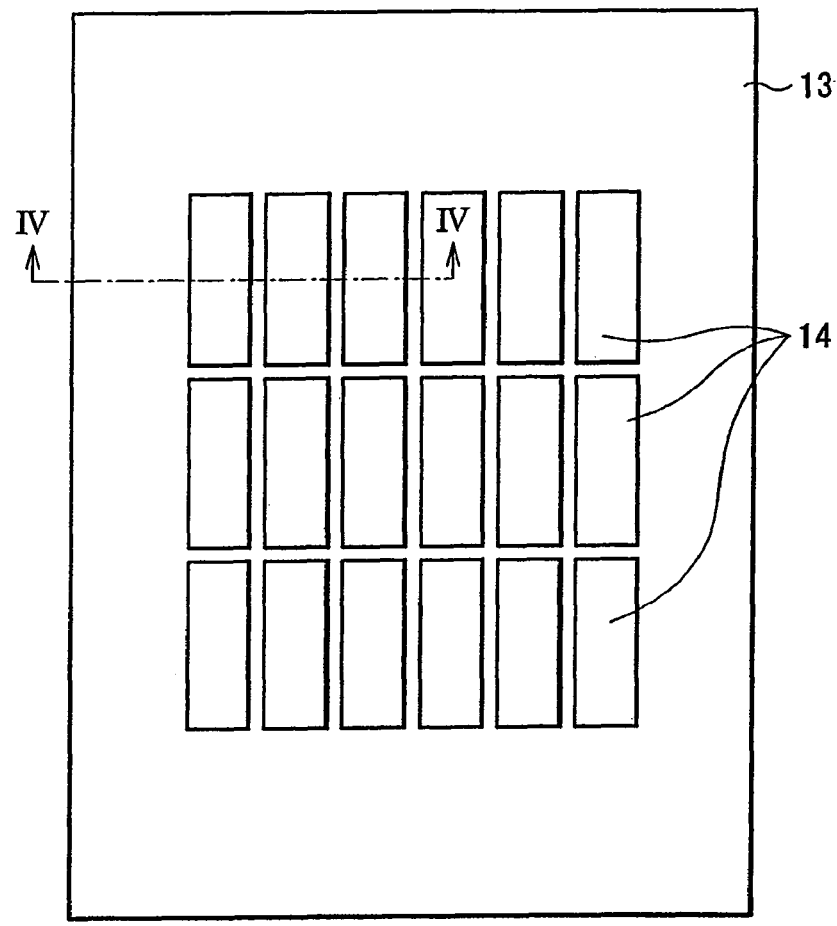
FIG. 11 is a plane view regarding a manufacturing process following the process of FIG. 10.
Figure 12:
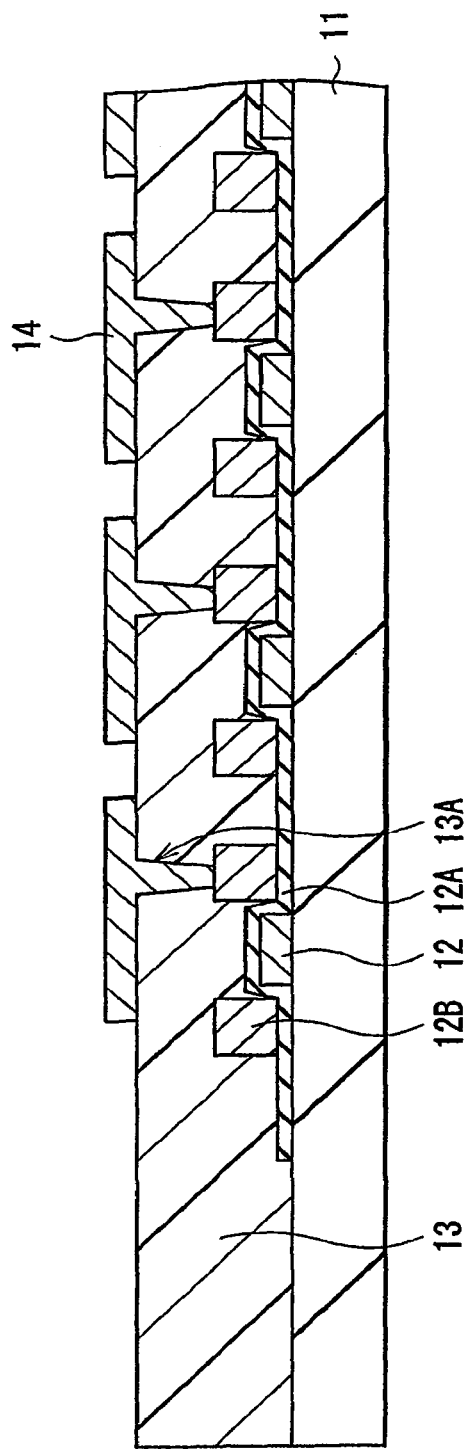
FIG. 12 is a cross sectional view taken along line IV-IV of FIG. 11.

Subsequently, as shown in FIGS. 11 and 12, first electrodes (individual electrodes) 14 are formed in the shape of a matrix on the planarizing layer 13 corresponding to respective devices by, for example, spattering and lithography technique. The first electrodes 14 are connected to the wiring 12B through the contact hole 13A. The first electrode 14 also has a function as a reflection layer. For example, the first electrode 14 preferably has a thickness of about 200 nm, and is made of a substance or an alloy of a metal element having a high work function, such as platinum (Pt), gold (Au), silver (Ag), chromium (Cr), tungsten (W) or the like.

Figure 13:
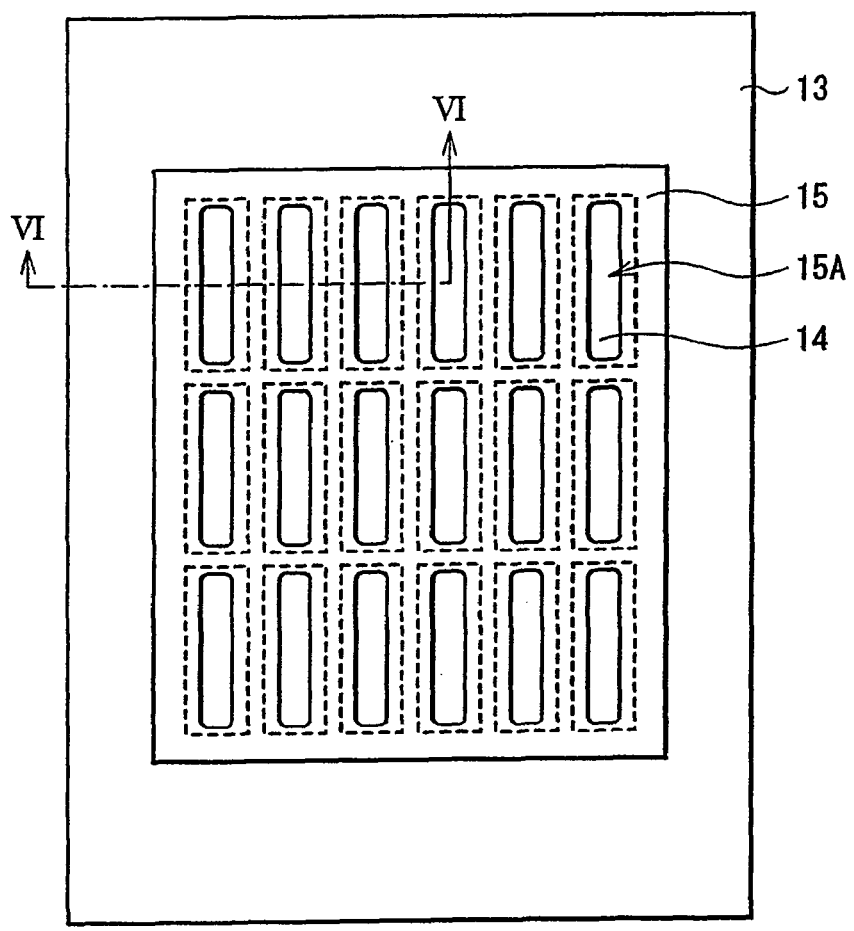
FIG. 13 is a plane view regarding a manufacturing process following the processes of FIGS. 11 and 12.
Figure 14:
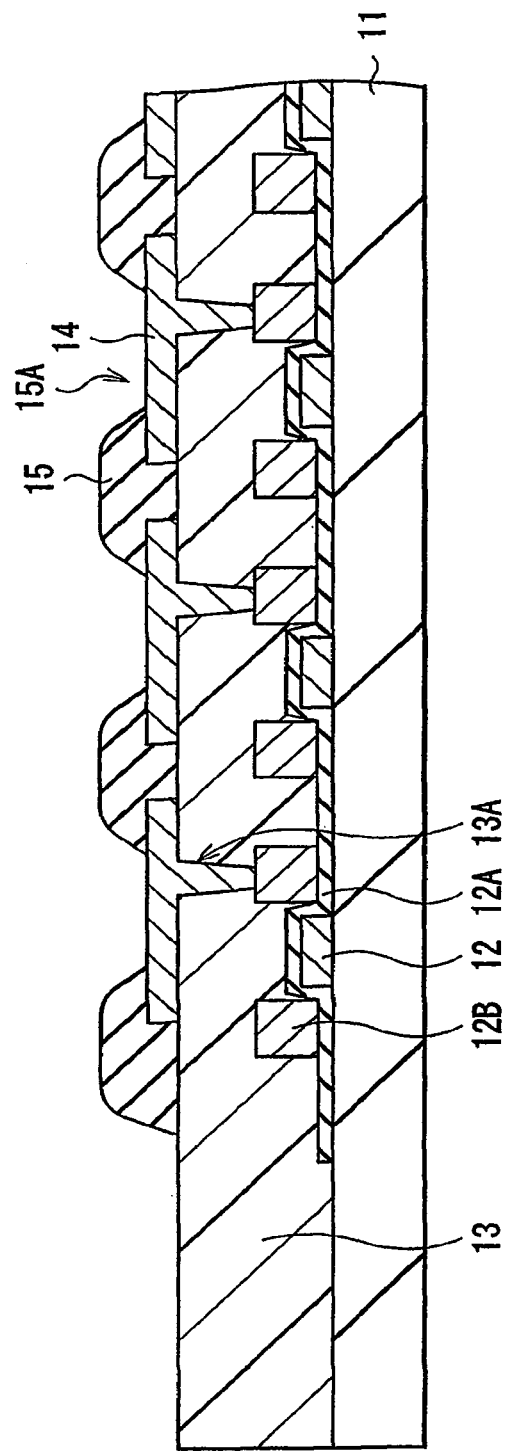
FIG. 14 is a cross sectional view taken along line VI-VI of FIG. 13.

After that, as shown in FIGS. 13 and 14, an insulating film 15 is formed in an area between lines and columns of the first electrodes 14 by, for example, CVD (Chemical Vapor Deposition) method and lithography technique, and openings 15A are formed corresponding to light emitting region. The insulating film 15 is provided in order to secure insulation between the first electrodes 14 and a second electrode 16, which will be described later, and accurately obtain a desired shape of light emitting region in the organic light emitting devices 10R, 10G, and 10B. For example, the insulating film 15 has a thickness of about 600 nm, and is made of an insulating material such as silicon oxide, polyimide and the like.

Figure 15:
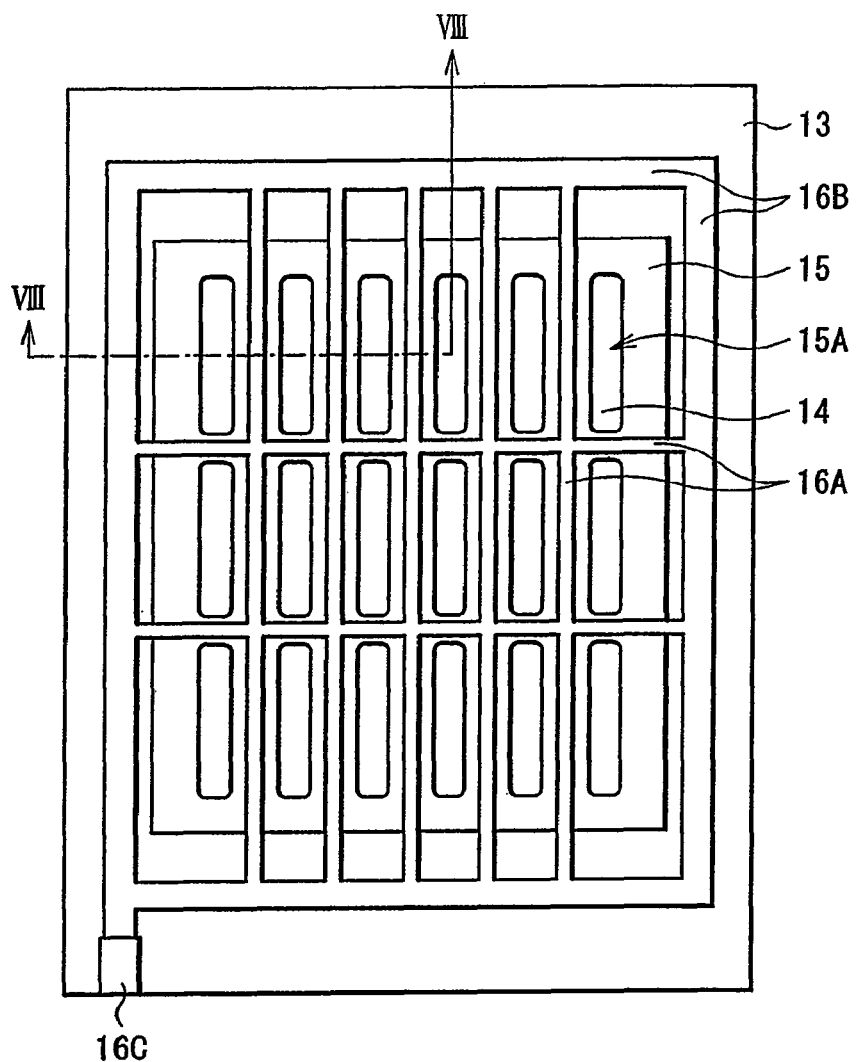
FIG. 15 is a plane view regarding a manufacturing process following the processes of FIGS. 13 and 14.
Figure 16:
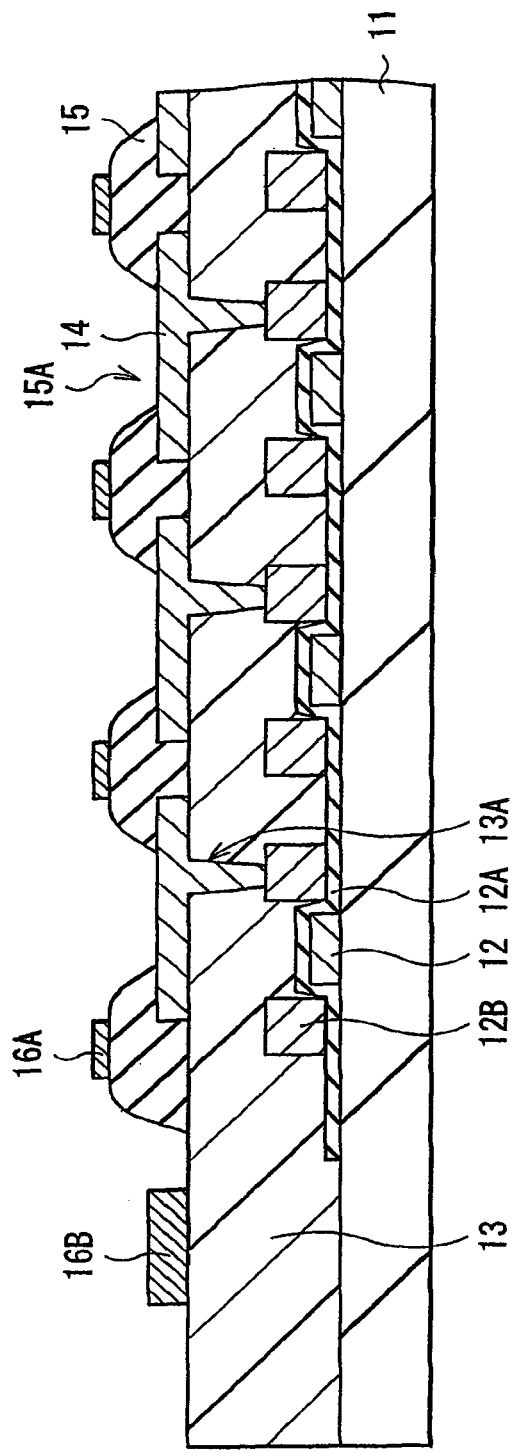
FIG. 16 is a cross sectional view taken along line VIII-VIII of FIG. 15.

Next, as shown in FIGS. 15 and 16, an auxiliary electrode 16A is formed in the shape of a matrix on the insulating film 15 by, for example, spattering and lithography technique. The auxiliary electrode 16A is provided in order to uniform a wiring resistance between a power source (not shown) and respective light emitting parts, and inhibit generation of emission unevenness (particularly emission unevenness between a central part and a peripheral part inside a picture) due to a difference of voltage drop. For example, the auxiliary electrode 16A has a monolayer structure or a layered structure of a conductive material having a low resistance, such as aluminum (Al), chromium (Cr) and the like. Further, as shown in FIGS. 15 and 16 as well, a trunk-shaped auxiliary electrode 16B which becomes a bus line of the auxiliary electrode 16A is formed in a peripheral area of the substrate 11 by, for example, spattering and lithography technique. The trunk-shaped auxiliary electrode 16B is made of a material similar to for the auxiliary electrode 16A, for example. However, since the trunk-shaped auxiliary electrode 16B is formed in the peripheral area of the substrate 11, its thickness and width can be made larger than that of the auxiliary electrode 16A. That is, it is possible to further lower a wiring resistance. The trunk-shaped auxiliary electrode 16B and the auxiliary electrode 16A are electrically connected by, for example, forming them so that ends of the auxiliary electrode 16A contact with the trunk-shaped auxiliary electrode 16B. The trunk-shaped auxiliary electrode 16B can be either formed integrally with the auxiliary electrode 16A in the same process, or formed in other process. In addition, the trunk-shaped auxiliary electrode 16B can be formed on the substrate 11. In this case, electrical connection between the trunk-shaped auxiliary electrode 16B and the auxiliary electrode 16A can be conducted with the planarizing layer 13 in between through the contact hole.

An extraction electrode 16C is provided at an end of the trunk-shaped auxiliary electrode 16B in order to connect the second electrode 16 to the power source (not shown). This extraction electrode 16C can be made of, for example, titanium (Ti)-aluminum (Al) or the like.

Figure 17:
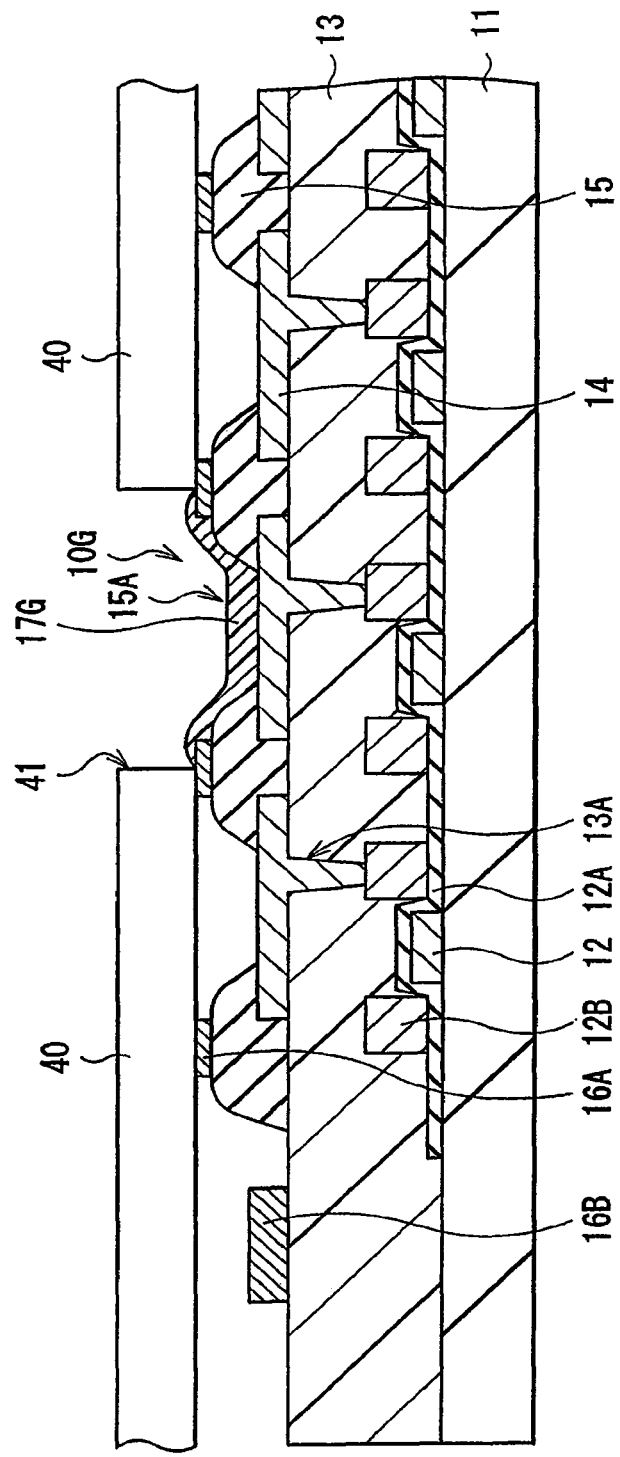
FIG. 17 is a cross sectional view regarding a manufacturing process following the processes of FIGS. 15 and 16.
Figure 18:
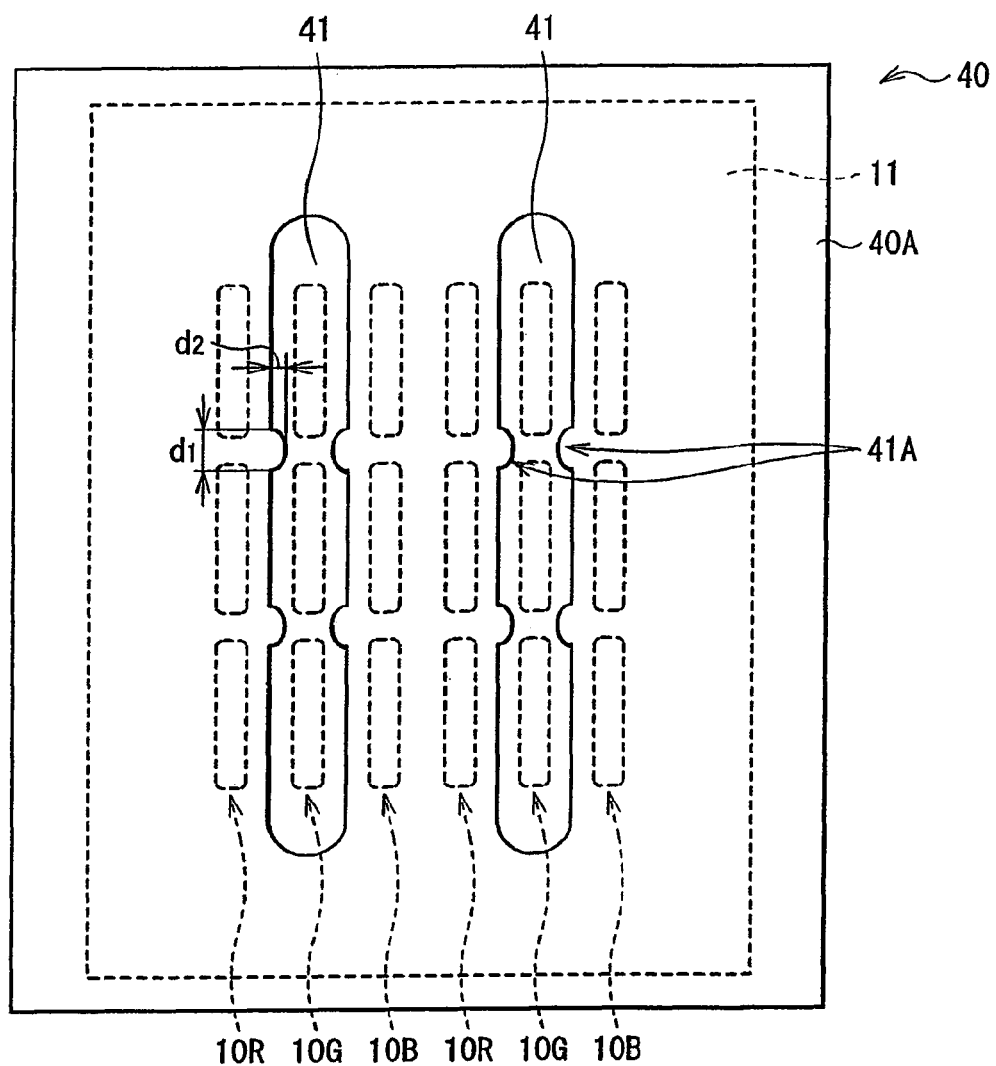
FIG. 18 is a plane view showing a construction of a deposition mask shown in FIG. 17.
Figure 19:
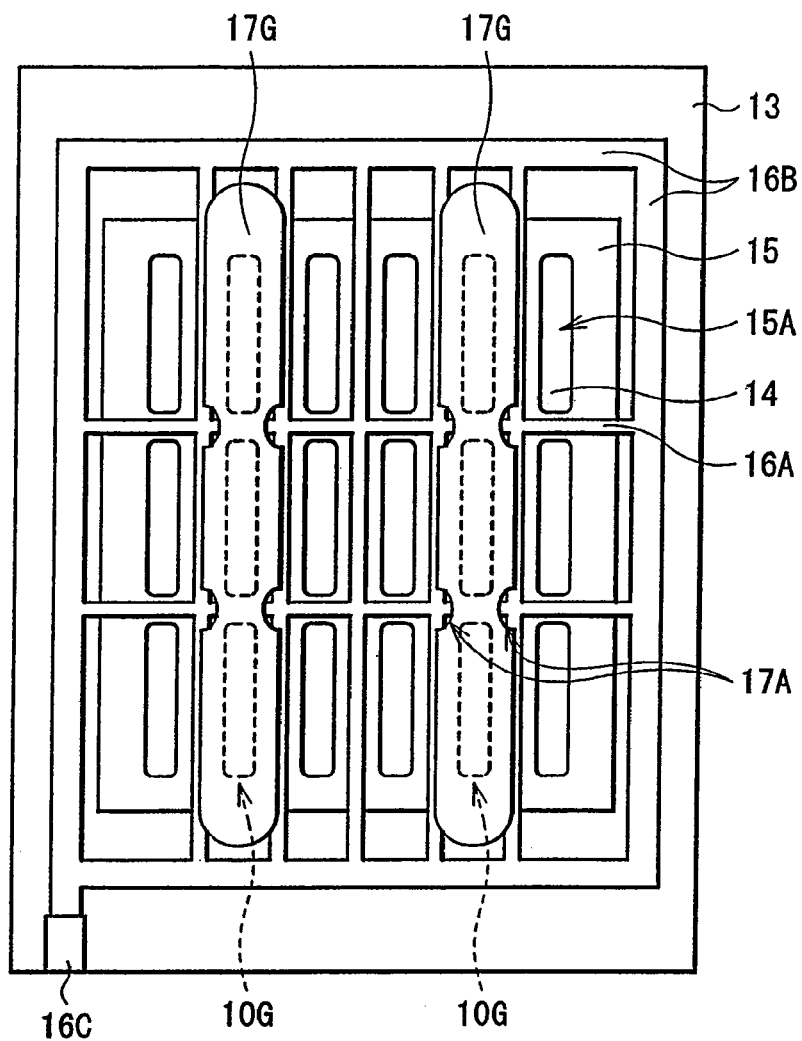
FIG. 19 is a plane view showing a condition wherein a green continuous organic layer is formed by using the deposition mask shown in FIGS. 17 and 18.

Subsequently, as shown in FIGS. 17 and 18, a green continuous organic layer 17G common to the organic light emitting devices 10G is formed by deposition method by using a deposition mask 40 having stripe-shaped openings 41. As shown in FIG. 19, the green continuous organic layer 17G having, for example, semioval notches 17A in an area between the organic light emitting devices 10G is thereby formed.

As the green continuous organic layer 17G, for example, an electron hole transport layer and a light emitting layer are layered in this order from the first electrode 14 side. The electron hole transport layer is provided in order to raise electron hole injection efficiency to the light emitting layer. The light emitting layer is provided in order to reconnect electrons and electron holes and generate light by applying electric field. Examples of the component material for the electron hole transport layer of the green continuous organic layer 17G include α-NPD and the like. Examples of the component material for the light emitting layer of the green continuous organic layer 17G include one wherein Coumarin 6 (C6) of 1 vol % is mixed with 8-quinolinol aluminum complex (Alq3).

The deposition mask 40 shown in FIGS. 17 and 18 includes a flat plate-shaped body part 40A made of a material having magnetic characteristics such as nickel (Ni) and an alloy containing nickel, and one or more, such as two, stripe-shaped openings 41. The opening 41 is arranged and formed so that a number of devices of the organic light emitting devices 10R, 10G, or 10B whose light emitting color is the same can be simultaneously formed. For example, as shown in FIGS. 17 and 18, the green continuous organic layer 17G common to the organic light emitting devices 10G can be formed by performing deposition by aligning the opening 41 with a position where the organic light emitting devices 10G can be formed. In this embodiment, the green continuous organic layer 17G is formed for a number, such as three, of organic light emitting devices 10G in common, differently from the conventional case, wherein the organic layer is formed for each organic light emitting device 10G. Therefore, generation of a film thickness distribution in the extensional direction of the green continuous organic layer 17G is dissolved. Consequently, its light emitting region can be expanded by just that much, and its aperture ratio can be raised.

In this embodiment, the body part 40A includes protrusions 41A to protrude inside the opening 41. The protrusion 41A is provided in order to provide the notch part 17A, which will be described later, on the green continuous organic layer 17G corresponding to an area between lines of the adjacent organic light emitting devices 10G. The protrusions 41A are, for example, provided as a pair at the relative positions on both sides in the width direction of the opening 41. There are a number of pairs (i.e., two pairs) of the protrusions 41A so that these pairs can correspond to respective positions between lines of the organic light emitting devices 10G.

Figure 20:
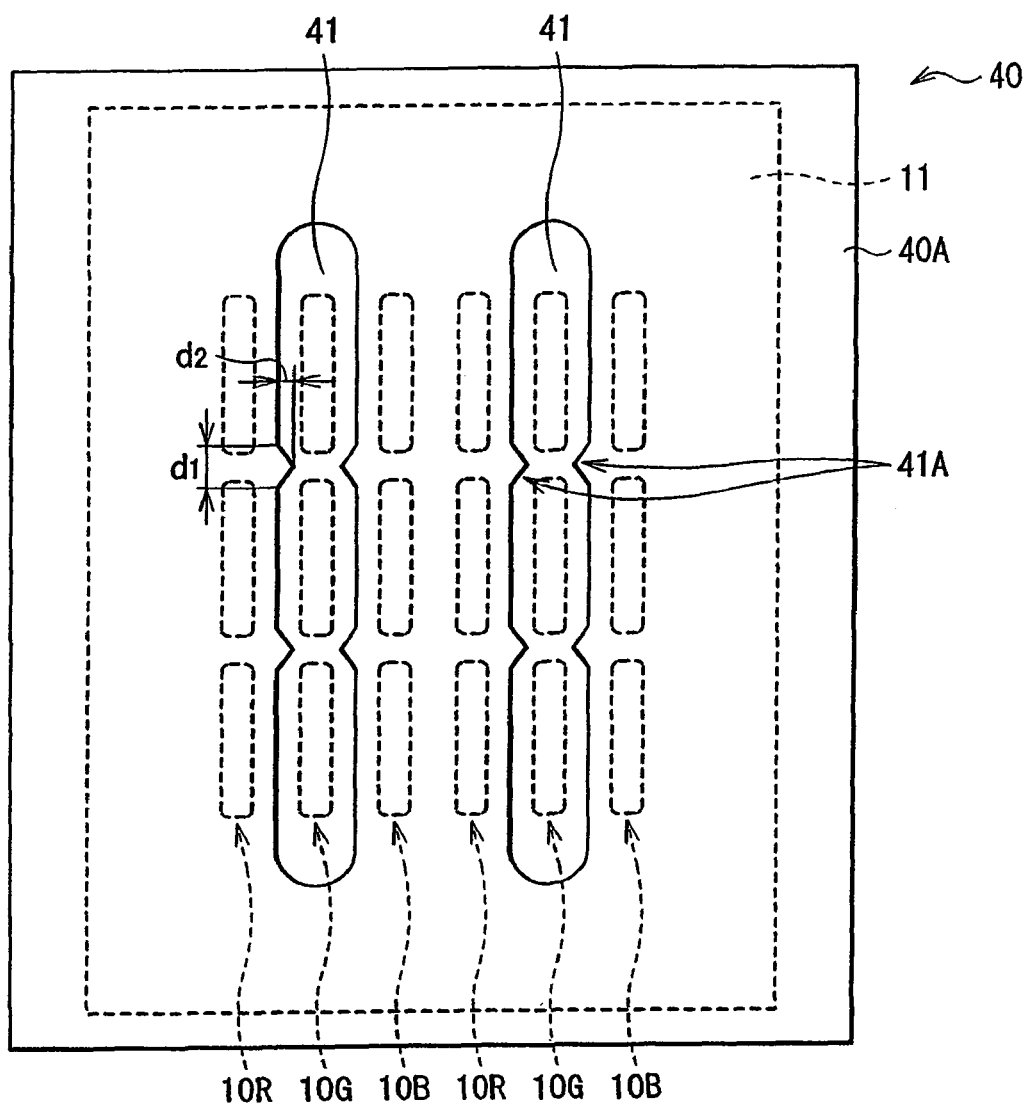
FIG. 20 is a plane view showing a modification of the deposition mask shown in FIG. 18.
Figure 21:
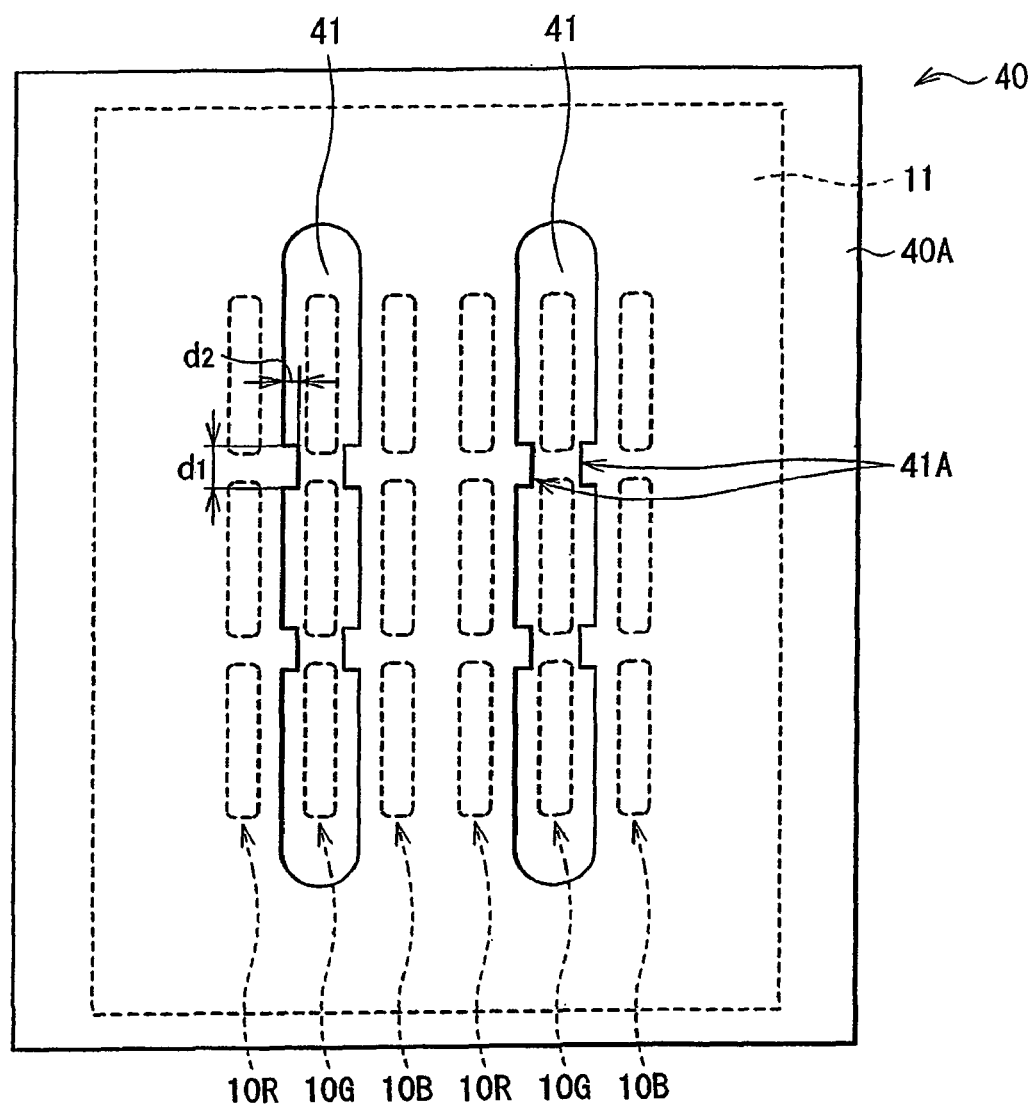
FIG. 21 is a plane view showing other modification of the deposition mask shown in FIG. 18.

A shape of the protrusion 41A is preferably set not to block the opening 15A of the insulating film 15, that is a light emitting region. If set as above, an after-mentioned contact part 18 between the auxiliary electrode 16A and the second electrode 16 can be provided without preventing improvement of an aperture ratio. Concrete examples of the shape of the protrusion 41A include the semioval shape shown in FIG. 18, a round shape such as semicircle (not shown), a triangle as shown in FIG. 20, and a non-circular shape such as a rectangle as shown in FIG. 21. Dimensions of the protrusion 41A are set as appropriate by considering a plate thickness of the deposition mask 40, position relation with the light emitting region, dimensions of the contact part 18 and the like. In this embodiment, dimensions of the protrusion 41A are set, for example, as follows: a dimension in the extensional direction of the opening 41, d1 is about 40 nm, and a dimension (width) in the direction perpendicular to the extensional direction of the opening 41, d2 is about 30 nm. The opening 41 and the protrusion 41A can be formed, for example, by etching or electroforming method.

Figure 22:
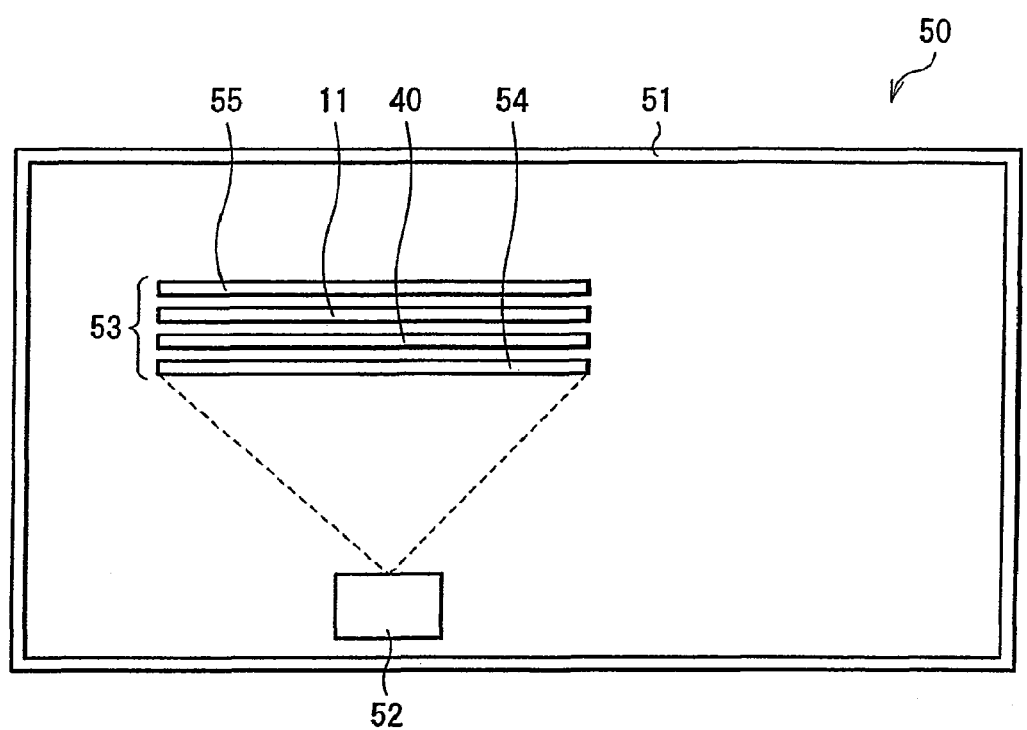
FIG. 22 is a view regarding an outline construction of a deposition apparatus used in the processes of FIGS. 17 and 19.

FIG. 22 shows an outline construction of a deposition apparatus to form the green continuous organic layer 17G by using such a deposition mask 40. This deposition apparatus 50 includes a deposition source 52 housing an organic material, which is a component material for the green continuous organic layer 17G inside a vacuum chamber 51. A work 53 wherein the deposition mask 40 is attached to the substrate 11 is arranged facing to the deposition source 52. Though unshown, a carry-in entrance and a vent for the work 53 are provided for the vacuum chamber 51.

A construction of the deposition source 52 is not particularly limited, and can be either a point source or a line source. As the deposition source 52, a resistance deposition source, an EB (Electron Beam) deposition source or the like can be used. The deposition source 52 can be provided respectively for the electron hole transport layer and the light emitting layer, the components for the green continuous organic layer 17G.

The work 53 can be either rotatable at a fixed position over the deposition source 52, or relatively movable in relation to the deposition source 52. The deposition mask 40 is attached on the substrate 11 on the deposition source 52 side, being held by a mask holder 54, and fixed by a sheet magnet 55 provided on the rear side of the substrate 11.

Figure 23:
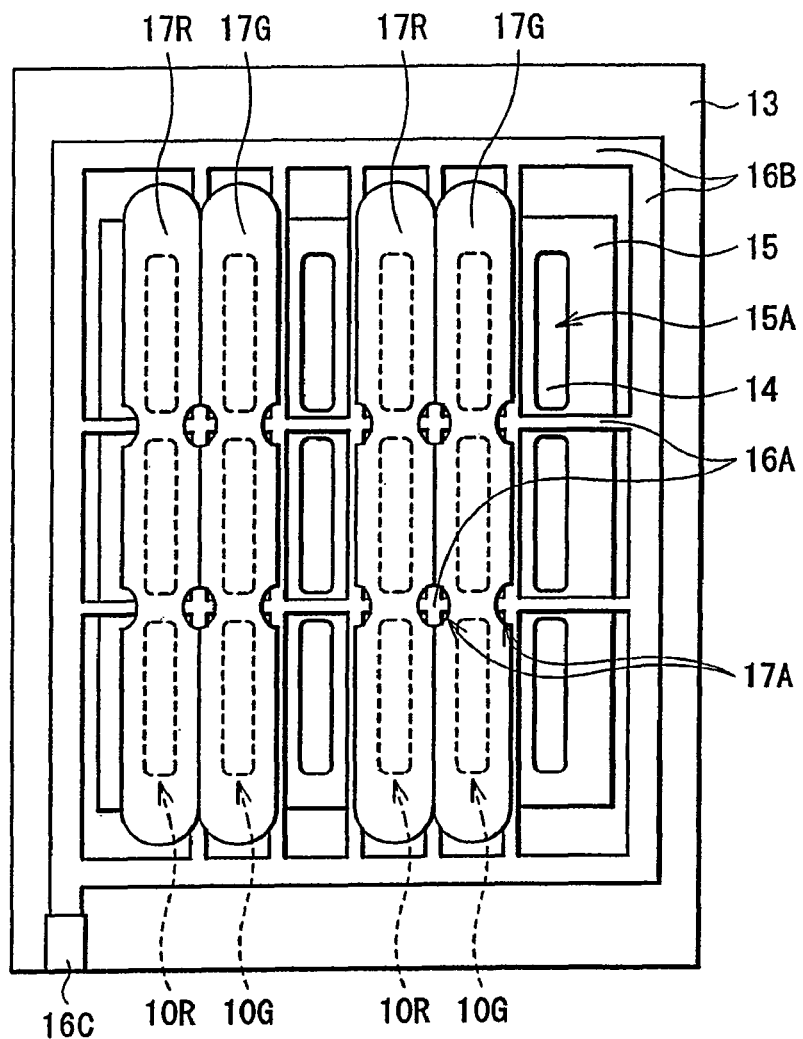
FIG. 23 is a plane view regarding a manufacturing process following the processes of FIGS. 17 and 19.

After the green continuous organic layer 17G is formed as above, the deposition mask 40 is aligned with a position where the organic light emitting devices 10R are to be formed, and a red continuous organic layer 17R, which has the notch parts 17A and which is common to the organic light emitting devices 10R is formed as shown in FIG. 23. A forming method for the red continuous organic layer 17R and a deposition apparatus used for it are similar to in the case of the green continuous organic layer 17G of the organic light emitting device 10G. Consequently, the notch part 17A of the green continuous organic layer 17G and the notch part 17A of the red continuous organic layer 17R are aligned, and in the aligned area, the auxiliary electrode 16A is exposed.

As the red continuous organic layer 17R, for example, an electron hole transport layer, a light emitting layer, and an electron transport layer are layered in this order from the first electrode 14 side. The electron transport layer is provided in order to raise electron injection efficiency to the light emitting layer. As a component material for the electron hole transport layer of the red continuous organic layer 17R, for example, bis[(N-naphthyl)-N-phenyl]benzidine (α-NPD) can be employed. As a component material for the light emitting layer of the red continuous organic layer 17R, for example, 2,5-bis[4-[N-(4-methoxy phenyl)-N-phenyl amino]] styryl benzene-1,4-dicarbonitrile (BSB) can be employed. As a component material for the electron transport layer of the red continuous organic layer 17R, for example, Alq3 can be employed.

Figure 24:
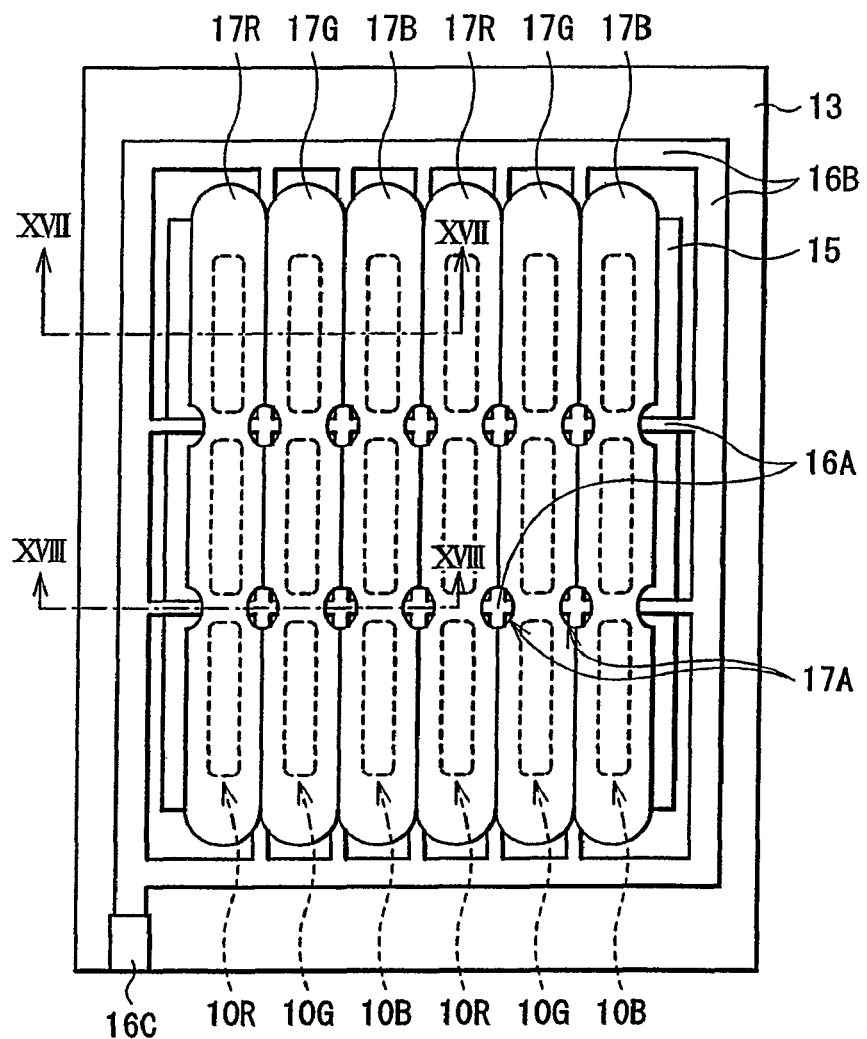
FIG. 24 is a plane view regarding a manufacturing process following the process of FIG. 23.
Figure 25:
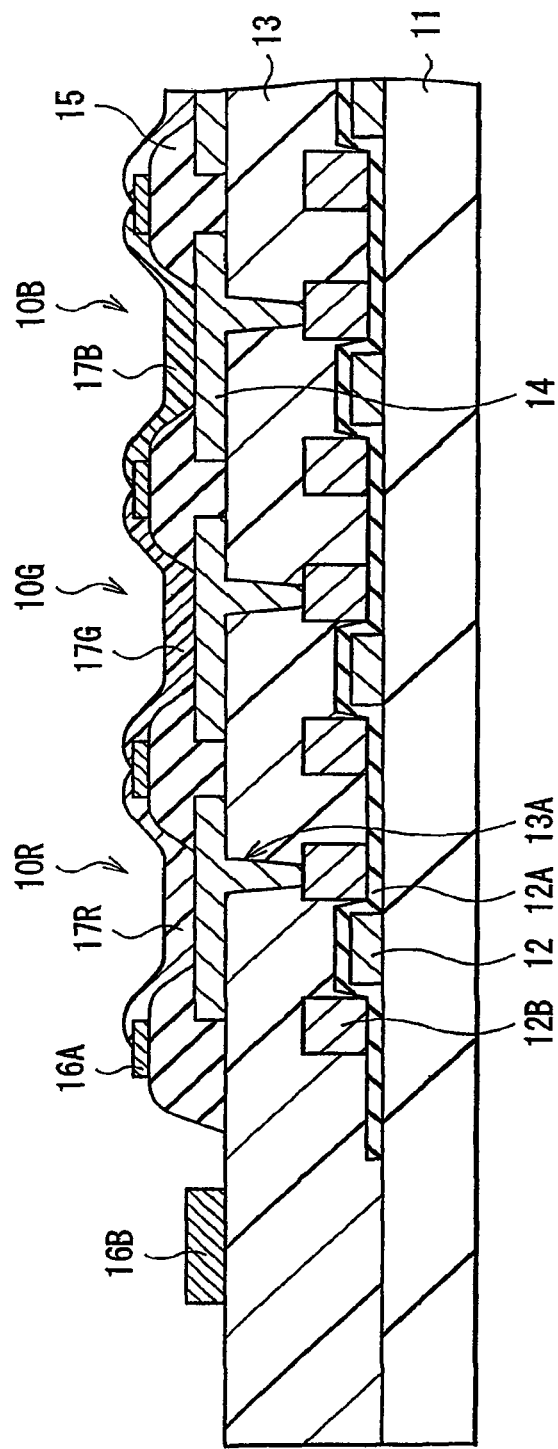
FIG. 25 is a cross sectional view taken along line XVII-XVII of FIG. 24.
Figure 26:
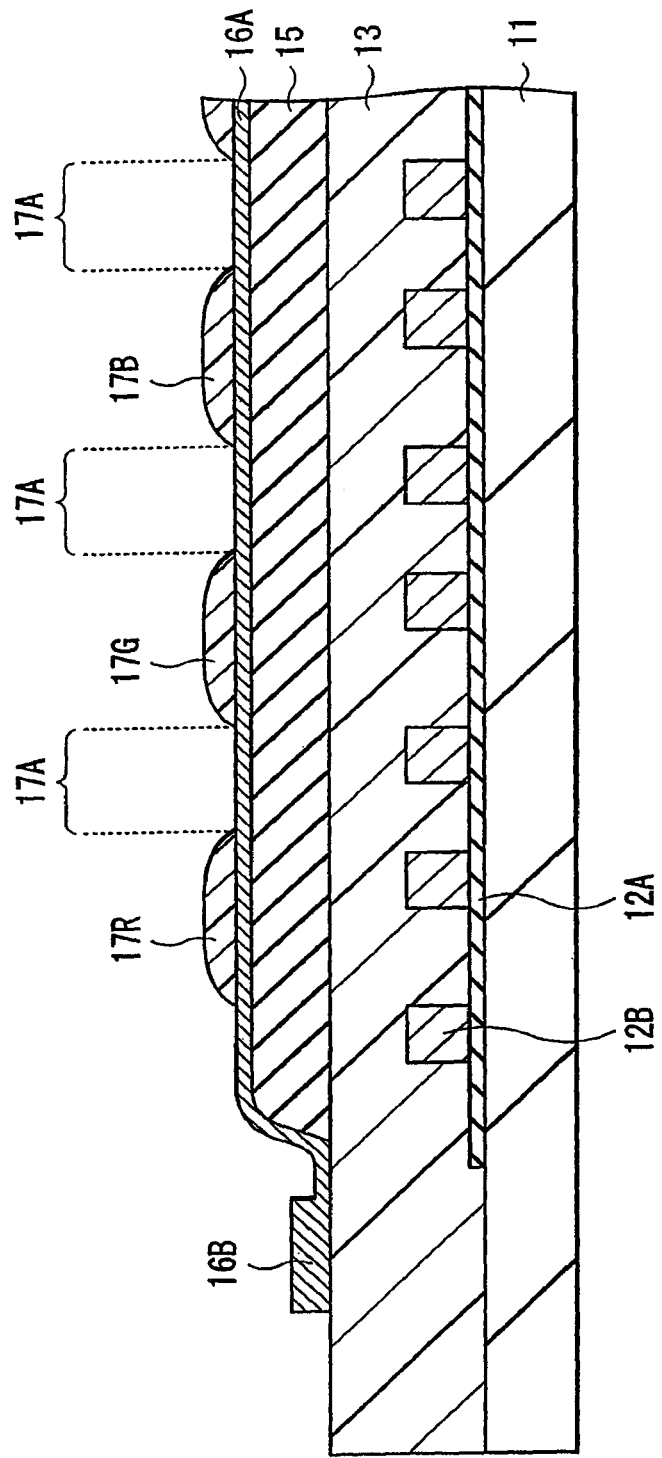
FIG. 26 is a cross sectional view taken along line XVIII-XVIII of FIG. 24.

Subsequently, the deposition mask 40 is moved again, and a blue continuous organic layer 17B which has the notch parts 17A and which is common to the organic light emitting devices 10B is formed as shown in FIGS. 24, 25, and 26. A method for forming the blue continuous organic layer 17B and a deposition apparatus used for it are similar to in the case of the green continuous organic layer 17G of the organic light emitting device 10G. Consequently, the notch part 17A of the blue continuous organic layer 17B and the notch part 17A of the green continuous organic layer 17G are aligned, and in the aligned area, the auxiliary electrode 16A is exposed. Further, the notch part 17A of the blue continuous organic layer 17B and the notch part 17A of the red continuous organic layer 17R are aligned, and in the aligned area, the auxiliary electrode 16A is exposed.

As the blue continuous organic layer 17B, for example, an electron hole transport layer, a light emitting layer, and an electron transport layer are layered in this order from the first electrode 14 side. As a component material for the electron hole transport layer of the blue continuous organic layer 17B, for example, α-NPD can be employed. As a component material for the light emitting layer of the blue continuous organic layer 17B, for example, 4,4'-bis(2,2'-diphenyl vinyl) biphenyl (DPVBi) can be employed. As a component material for the electron transport layer of the blue continuous organic layer 17B, for example, Alq3 can be employed.

Figure 27:
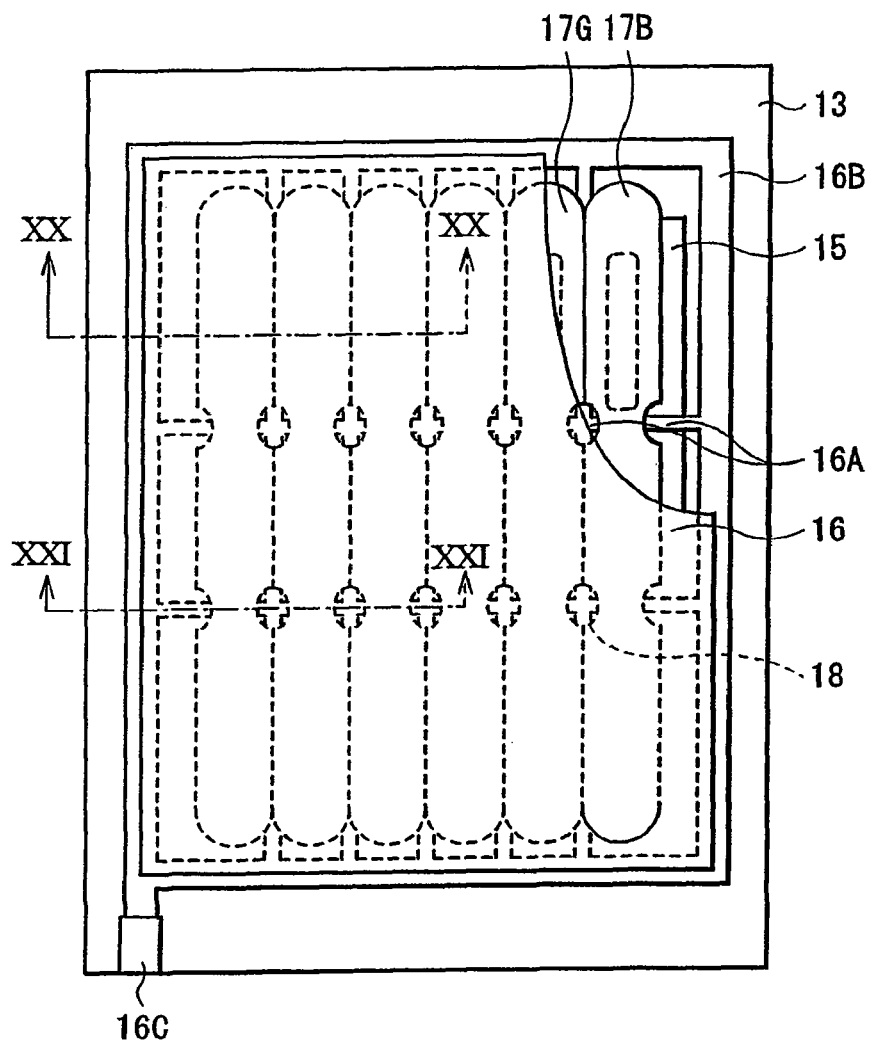
FIG. 27 is a plane view regarding a manufacturing process following the process of FIG. 24.
Figure 28:
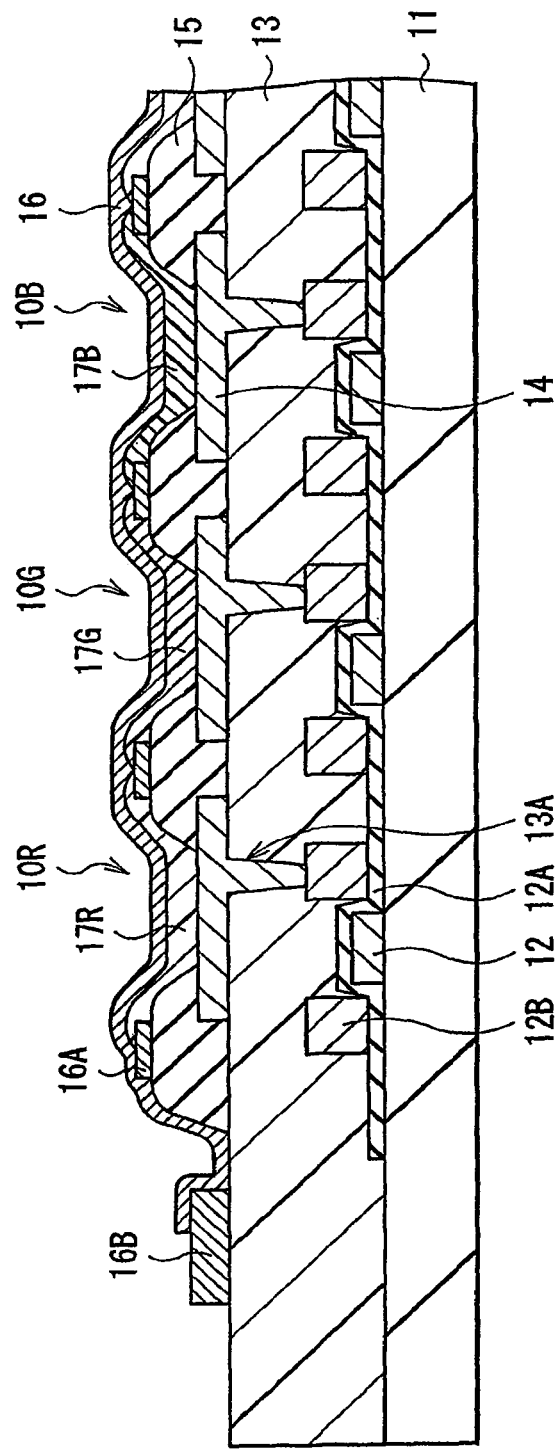
FIG. 28 is a cross sectional view taken along line XX-XX of FIG. 27.
Figure 29:
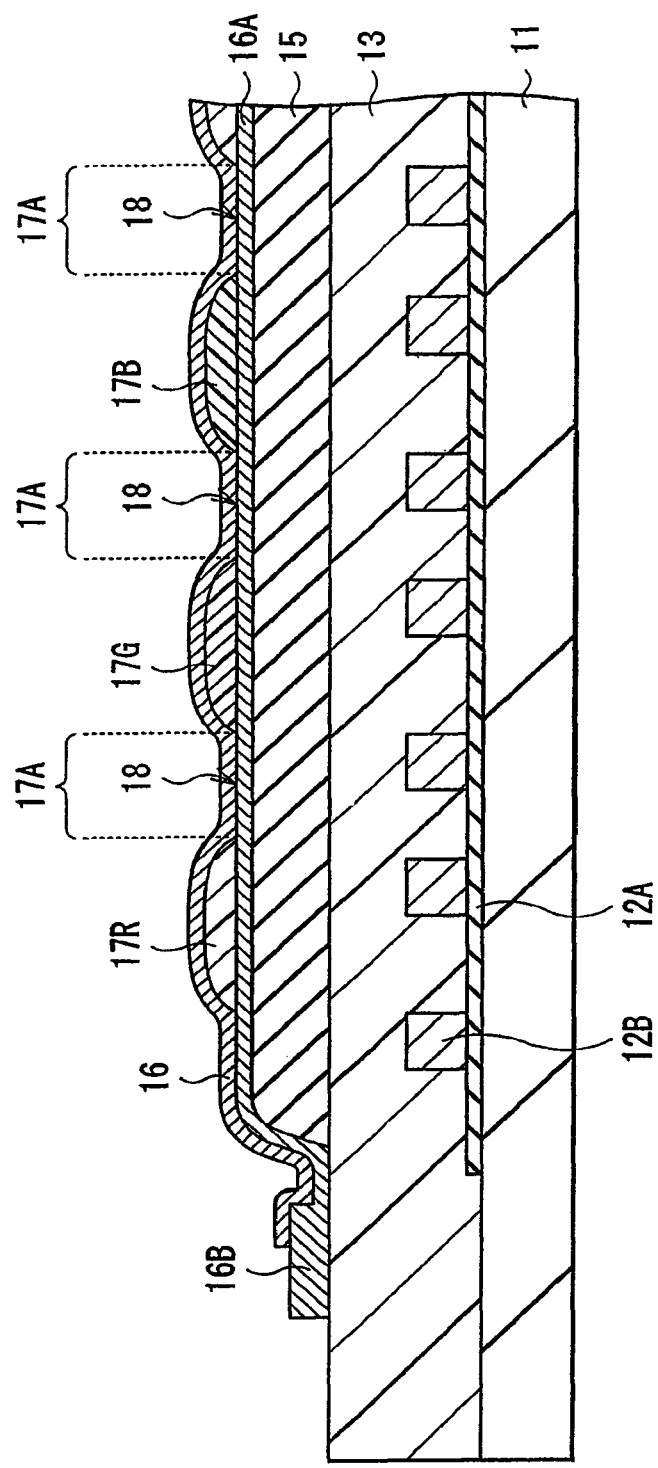
FIG. 29 is a cross sectional view taken along line XXI-XXI of FIG. 27.

After the red continuous organic layer 17R, the green continuous organic layer 17G, and the blue continuous organic layer 17B are formed, as shown in FIGS. 27, 28, and 29, the second electrode 16 covering almost a whole area of the substrate 11 is formed by, for example, deposition method. The second electrode 16 includes a semi-transparent electrode, and light generated in the light emitting layer is extracted from the second electrode 16 side. For example, the second electrode 16 has a thickness of about 10 nm, and made of metal such as silver (Ag), aluminum (Al), magnesium (Mg), calcium (Ca), and sodium (Na), the like or an alloy thereof. In this embodiment, for example, the second electrode 16 includes an alloy (MgAg alloy) of magnesium (Mg) and silver.

By forming the second electrode 16 to cover almost the whole area of the substrate 11, the contact part 18 between the auxiliary electrode 16A and the second electrode 16 is formed at the notch part 17A, and the auxiliary electrode 16A and the second electrode 16 are electrically connected. Further, the second electrode 16 is formed to cover at least part of the trunk-shaped auxiliary electrode 16B, so that the second electrode 16 and the trunk-shaped auxiliary electrode 16B are electrically connected. The organic light emitting devices 10R, 10G, and 10B are thereby formed.

Figure 30:
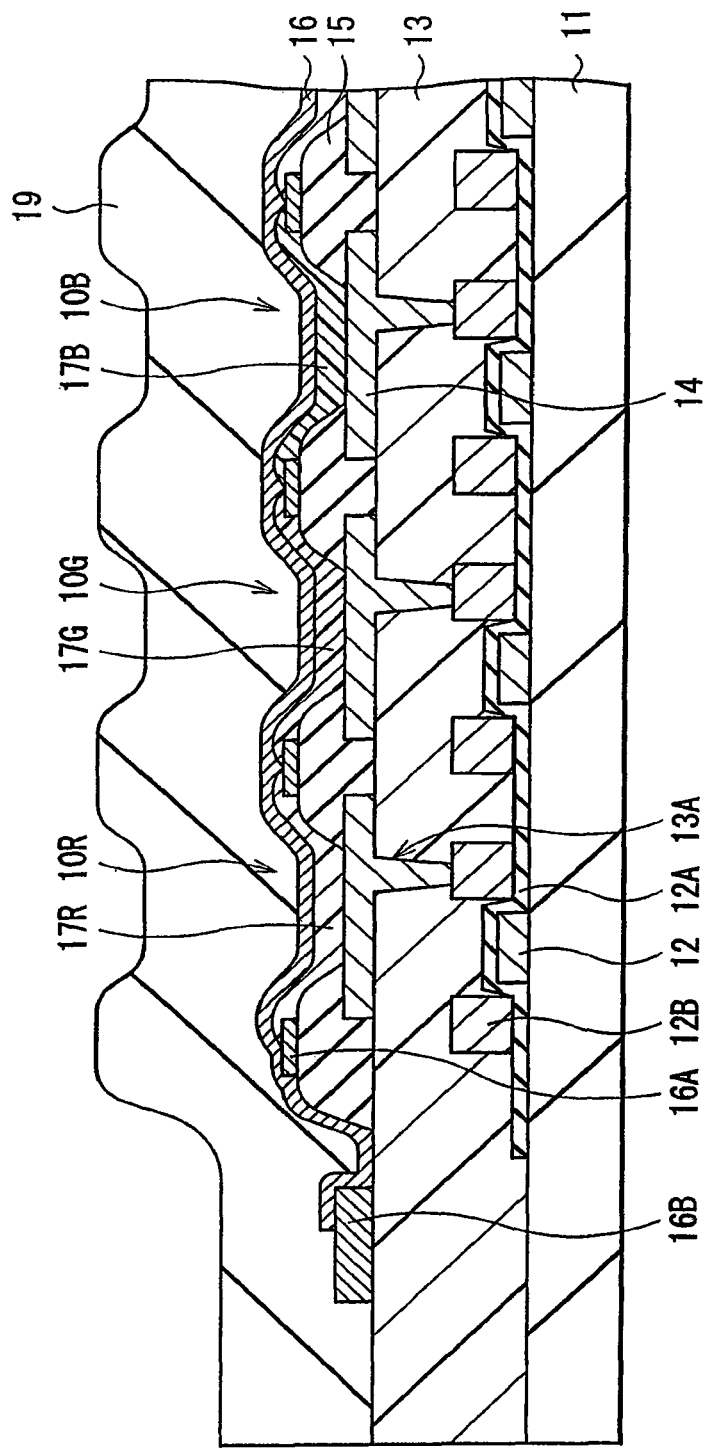
FIG. 30 is a cross sectional view to regarding a manufacturing process following the process of FIG. 27.

Next, as shown in FIG. 30, a protective film 19 is formed on the second electrode 16 by, for example, deposition method, CVD method, spattering or the like. For example, the protective film 19 has a thickness from about 500 nm to about 10,000 nm, and includes a transparent dielectric such as silicon oxide (SiO2), silicon nitride (SiN) and the like.

As shown in FIG. 31A, for example, on a sealing substrate 21 made of a material such as glass transparent to light generated in the organic light emitting devices 10R, 10G, and 10B, a red filter 22R is formed by applying a material for the red filter 22R by spin coat or the like by patterning with photolithography technique and by firing. Subsequently, as shown in FIG. 31B, a blue filter 22B and a green filter 22G are sequentially formed in a manner similar to in the red filter 22R. A color filter 22 is thereby formed on the sealing substrate 21. The color filter 22 is provided in order to extract light generated in the organic light emitting devices 10R, 10G, and 10B, absorb outside light reflected in the organic light emitting devices 10R, 10G, and 10B, and the wiring therebetween, and improve the contrast.

Figure 32:
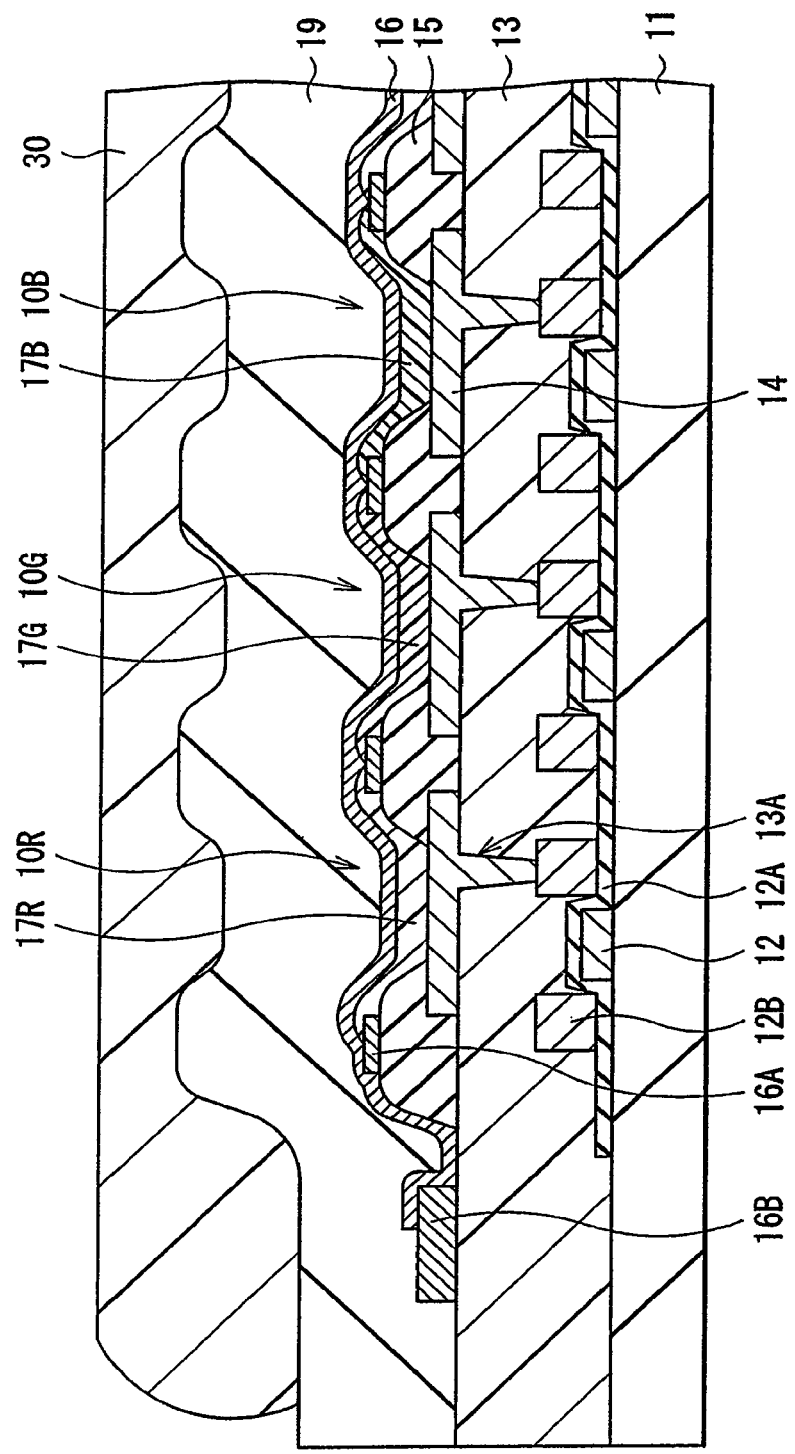
FIG. 32 is a cross sectional view regarding a manufacturing process following the processes of FIGS. 31A and 31B.
Figure 33:
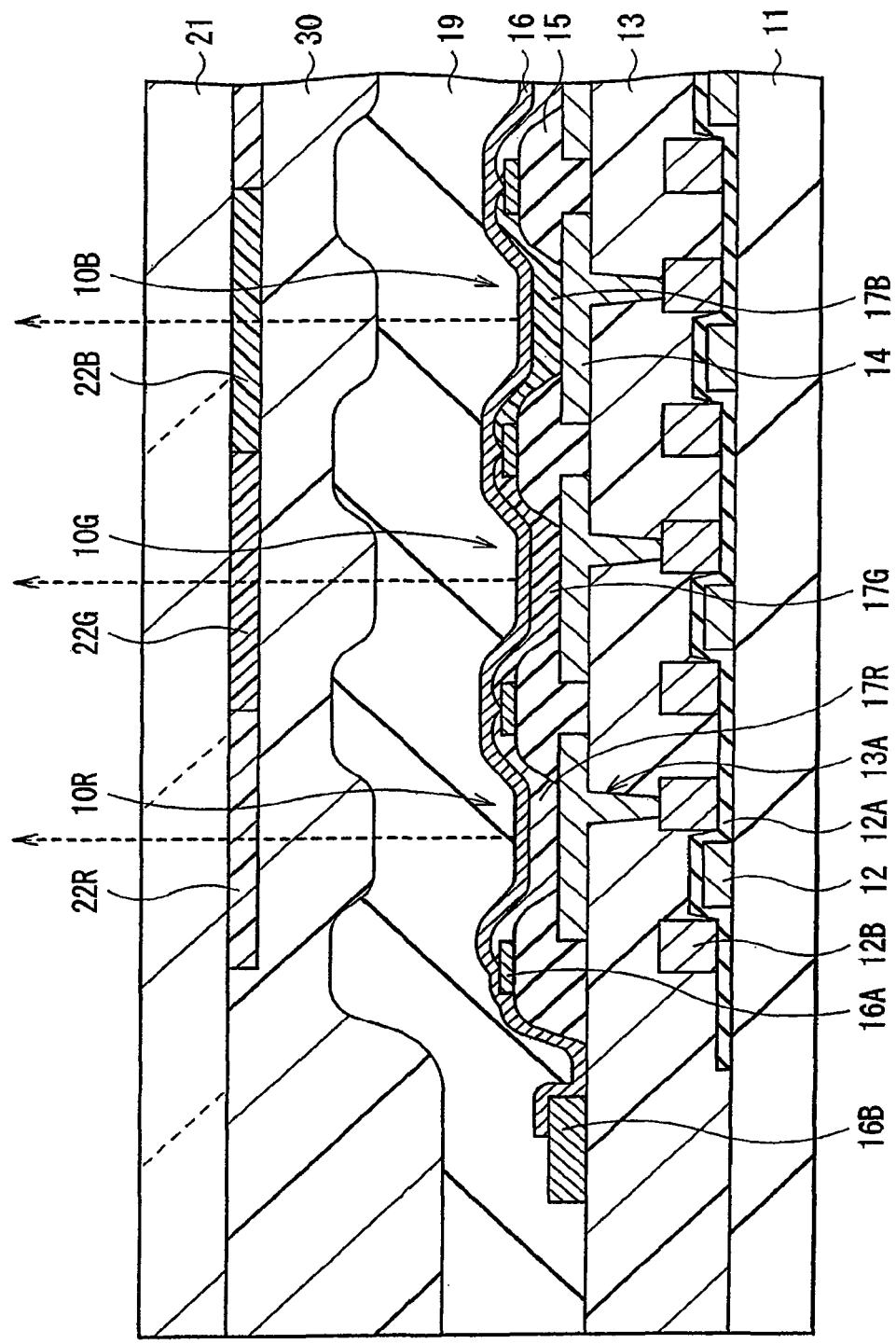
FIG. 33 is a cross sectional view regarding a manufacturing process following the process of FIG. 32.

After that, as shown in FIG. 32, an adhesive layer 30 made of, for example, a thermosetting resin is formed by coating on the side where the organic light emitting devices 10R, 10G, and 10B are formed of the substrate 11. Coating can be made by, for example, discharging a resin from a slit nozzle type dispenser, roll coating, or screen printing. Next, as shown in FIG. 33, the substrate 11 and the sealing substrate 21 are bonded together with the adhesive layer 30 in between. In this regard, it is preferable that a side of the sealing substrate 21 where the color filter 22 is formed is arranged facing to the substrate 11. It is preferable that air bubbles or the like does not enter into the adhesive layer 30. After that, relative positions of the color filter 22 of the sealing substrate 21 and the organic light emitting devices 10R, 10G, and 10B of the substrate 11 are aligned. Then, the thermosetting resin of the adhesive layer 30 is cured by heat treatment for a given time at a given temperature. The display unit according to this embodiment is thereby completed.

In the display unit manufactured as above, when a given voltage is applied between the first electrodes 14 and the second electrode 16, current is injected in the light emitting layer of the continuous organic layer 17, electron holes and electrons are recombined. Consequently, light emitting is generated. This light is extracted from the sealing substrate 21 side. In this case, the red continuous organic layer 17R is provided for the number of (three in FIG. 19) organic light emitting devices 10R in common, the green continuous organic layer 17 G is provided for the number of organic light emitting devices 10G in common, and the blue continuous organic layer 17B is provided for the number of organic light emitting devices 10B in common, respectively. Therefore, differently from the conventional case of forming the organic layers corresponding to respective organic light emitting devices, each device is free from or without a film thickness distribution in the extensional direction of the red continuous organic layer 17R and so on, and has an even thickness.

Further, the notch parts 17A are provided at a position corresponding to a non-light emitting region (that is, an area between lines of the matrix configuration) of the red continuous organic layer 17R, the green continuous organic layer 17G, and the blue continuous organic layer 17B. Therefore, the contact part 18 between the second electrode 16 and the auxiliary electrode 16A is formed for each device without lowering the aperture ratio.

Figure 34:
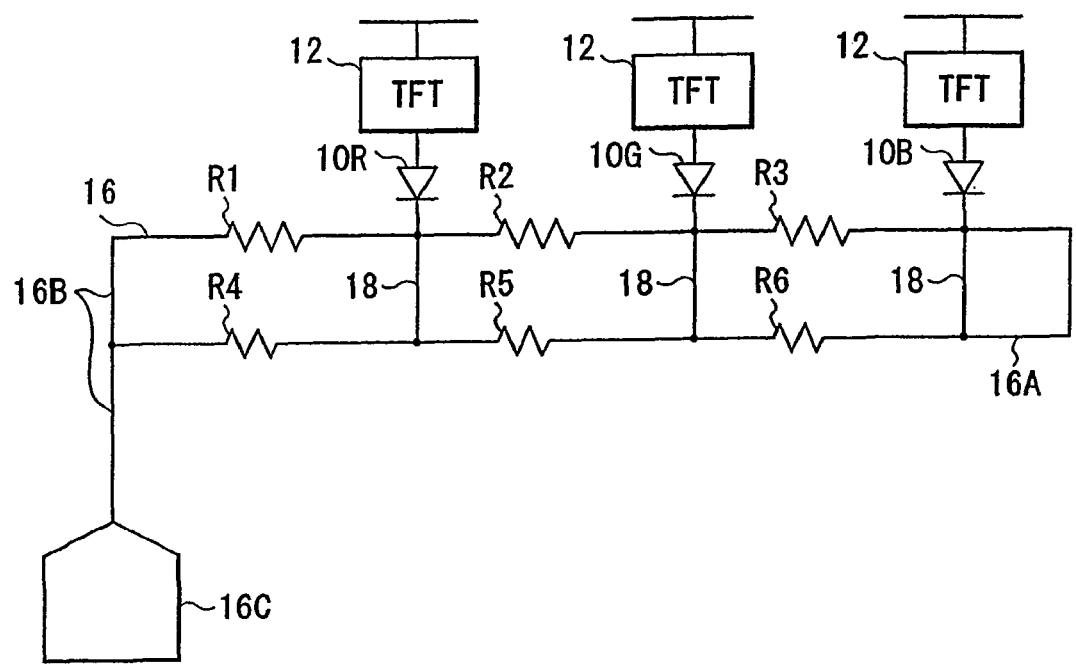
FIG. 34 is a view regarding an operation of a display unit shown in FIG. 33.

FIG. 34 shows an equivalent circuit diagram of a connection circuit part between respective devices and the extraction electrode 16C. Since the second electrode 16 includes a thin film common electrode, a resistance component R1 between the extraction electrode 16C and the device closest to the extraction electrode 16C, and resistance components R2 and R3 between devices are high, and voltage drop varies depending on differences of distance between respective devices and the extraction electrode 16C, causing luminance variation between the central part and the peripheral part in the display screen. In this embodiment, the second electrode 16 is electrically connected to the auxiliary electrode 16A through the contact part 18 at the position corresponding to respective devices. The auxiliary electrode 16A has a thick film thickness, and a resistance component R4 between the extraction electrode 16C and the device closest to the extraction electrode 16C, and resistance components R5 and R6 between devices are relatively small compared to resistance components R1 to R3. That is, in a route from the extraction electrode 16C to respective devices through the auxiliary electrode 16A and the contact part 18, wiring resistance differences between the extraction electrode 16C and respective devices are reduced and uniformed. Therefore, current sent from the power source (not shown) and supplied through the electrode 16C is applied to respective devices through the auxiliary electrodes 16A and the contact part 18 without raising any large difference in voltage drop. Consequently, display is realized with an even luminance over the whole screen.

As above, in this embodiment, the red continuous organic layer 17R, the green continuous organic layer 17G, and the blue continuous organic layer 17B are provided for the number of organic light emitting devices 10R, 10G, and 10B in common, respectively. Therefore, a film thickness distribution is dissolved in the extensional direction of the red continuous organic layer 17R, the green continuous organic layer 17G, and the blue continuous organic layer 17B, and an aperture ratio can be improved by just that much. Further, the contact part 18 between the second electrode 16 and the auxiliary electrode 16A is formed at the notch parts 17A formed in the non-light emitting region of respective continuous organic layers. Therefore, the contact part 18 can be formed corresponding to respective devices inside the panel, and wiring resistance differences between the extraction electrode 18C and respective devices can be reduced and uniformed. Consequently, luminance variation between the center and the peripheral part in the display screen can be remedied.

Figure 35:
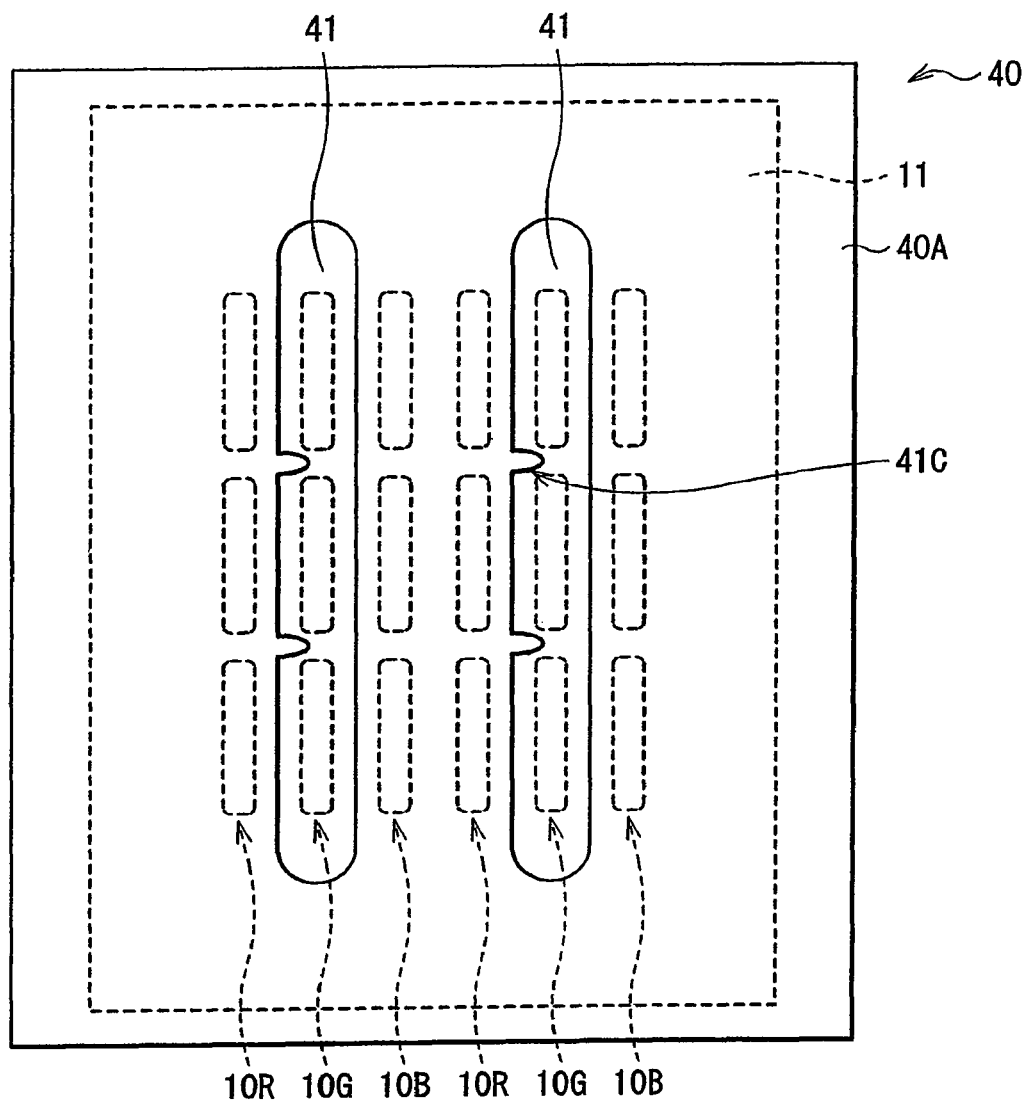
FIG. 35 is a plane view showing still another modification of the deposition mask shown in FIG. 18.

While the invention has been described with reference to the embodiment, the invention is not limited to the foregoing embodiment, and various modifications may be made. For example, in the foregoing embodiment, the case wherein the protrusions 41A are provided so that these protrusions 41A make a pair at the relative positions on the both sides in the width direction of the opening 41, and the notch parts 17A are positioned adjacent to each other has been described. However, as shown in FIG. 35, it is possible that a long protrusion 41C is provided in the width direction only at one side in the width direction of the opening 41, and the contact part 18 is formed without positioning the notch parts 17A adjacent to each other. However, the foregoing embodiment is preferable, since it is possible to surely obtain the effect to improve an aperture ratio by reducing a film thickness distribution in the extensional direction of the red continuous organic layer 17R, the green continuous organic layer 17G, and the blue continuous organic layer 17B. When the protrusion 41C is provided only at one side in the width direction of the opening 41, it is not always necessary to provide the protrusions 41 only at the same side in the width direction of the opening 41.

In the foregoing embodiment, the case wherein the organic light emitting devices 10R, 10G, and 10B are respectively arranged in line, and the red continuous organic layer 17R, the green continuous organic layer 17G, and the blue continuous organic layer 17B are formed in the shape of a straight stripe has been described. However, it is no problem as long as the red continuous organic layer 17R, the green continuous organic layer 17G, and the blue continuous organic layer 17B are formed for two or more lines of the organic light emitting devices 10R, 10G, and 10B in common. It is not necessarily that the organic light emitting devices 10R, 10G, and 10B are respectively arranged in line. For example, it is possible that the organic light emitting devices 10R, 10G, and 10B are arranged in the staggered shape.

In the foregoing embodiment, the case wherein the auxiliary electrode 16A is formed in the shape of a matrix in the area between lines and columns of the first electrodes 14 on the insulating film 15 has been described. However, the auxiliary electrode 16A can be provided only in the area between lines of the first electrodes 14, or only in the area between columns of the first electrodes 14.

The materials, thicknesses, deposition methods, deposition conditions and the like of respective layers are not limited to those described in the foregoing embodiment. Other materials, thicknesses, deposition methods, and deposition conditions can be applied. For example, film-forming order of the red continuous organic layer 17R, the green continuous organic layer 17G, and the blue continuous organic layer 17B is not limited to the order described in the foregoing embodiment.

For example, in the foregoing embodiment, the case wherein the first electrodes 14, the continuous organic layer 17, and the second electrode 16 are layered in this order from the substrate 11 side, and light is extracted from the sealing substrate 21 side has been described. However, light can be extracted from the substrate 11 side. However, in the foregoing embodiment, the TFTs 12 are provided on the substrate 11 corresponding to the respective organic light emitting devices 10R, 10G and 10B, and the organic light emitting devices 10R, 10G and 10B are driven by these TFTs 12. Therefore, it is more beneficial to extract light from the sealing substrate 21 side wherein no TFTs 12 are provided, since an aperture ratio becomes large and effect of the invention can be further improved.

For example, in the foregoing embodiment, the case wherein the first electrode 14 is set to an anode and the second electrode 16 is set to a cathode. However, it is possible that the anode and the cathode are inversed, that is, the first electrode 14 can be set to a cathode and the second electrode 16 can be set to an anode. Further, along with setting the first electrode 14 to the cathode and the second electrode 16 to the anode, it is possible to extract light from the substrate 11 side.

In the foregoing embodiment, the concrete example of the construction of the organic light emitting devices 10R, 10G, and 10B has been described. However, it is not necessary that all layers are provided. In addition, other layers can be further provided. Layer constructions and component materials for the red continuous organic layer 17R, the green continuous organic layer 17G, and the blue continuous organic layer 17B of the organic light emitting devices 10R, 10G, and 10B are not limited to the case in the foregoing embodiment.

In the foregoing embodiment, the case wherein the invention is applied to the color display has been described. However, the invention can be applied to the case of a mono-color display.

As described above, according to the deposition mask of the invention and the method for manufacturing the display unit of the invention, the continuous organic layer common to at least two lines of the matrix configuration of the number of organic light emitting devices is formed through the stripe-shaped opening provided on the body part of the deposition mask. Therefore, a film thickness distribution in the extensional direction of the continuous organic layer can be dissolved, and an aperture ratio can be improved by just that much. Further, in the deposition mask, the protrusions are provided to partly protrude inside the opening. Therefore, the notch parts to become the contact part between the auxiliary electrode and the second electrode (common electrode) can be formed on the continuous organic layer, and wiring resistance differences between the power source and respective devices can be reduced and uniformed. Consequently, a luminance variation between the center and the peripheral part of the display screen can be improved.

According to the display unit of the invention, the auxiliary electrode and the second electrode are electrically connected through the contact part formed at the notch parts of the continuous organic layer. Therefore, current supplied from the power source can be applied to respective devices through the auxiliary electrode and the contact part without generating large difference in voltage drop. Consequently, a luminance variation between the center and the peripheral part of the display screen can be improved, and display can be realized with even luminance over the whole area of the screen.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention is claimed as follows:

1. A display unit comprising:
a first insulating film;
a plurality of anode electrodes disposed on the first insulating film;
a second insulating film disposed on the plurality of anode electrodes;
a plurality of organic layers disposed on the anode electrodes;
a cathode electrode disposed on the plurality of organic layers;
an extraction electrode;
a first wiring disposed on the first insulating film and provided in a peripheral area of the plurality of anode electrodes; and
a second wiring disposed on the first insulating film and provided between two rows of the plurality of anode electrodes adjacent to one another,
wherein the cathode electrode is connected to the extraction electrode via the first wiring,
wherein the plurality of organic layers are provided over the two rows of the plurality of anode electrodes,
wherein the plurality of organic layers have a notch part at a portion corresponding to the contact region, and
wherein the second wiring is connected to the cathode electrode at the contact region.

2. The display unit according to claim 1, wherein the plurality of organic layers have a stripe shape.

3. The display unit according to claim 1, wherein the plurality of organic layers are continuously provided over the two or more lines of the anode electrodes.

4. The display unit according to claim 1, wherein the corresponding notch parts of adjacent organic layers are coincident with one another.

5. The display unit according to claim 1, wherein the second wiring is connected to the first wiring.

6. The display unit according to claim 1, wherein the cathode electrode is made of metal including at least one of silver (Ag), aluminum (Al), magnesium (Mg), calcium (Ca), and sodium (Na).

7. The display unit according to claim 1, further comprising a protective film disposed on the cathode electrode.

8. The display unit according to claim 7, wherein the protective film has a thickness from about 500 nm to about 10,000 nm.

9. The display unit according to claim 7, wherein the protective film includes at least one of silicon oxide ($SiO_2$) and silicon nitride (SiN).

10. The display unit according to claim 1, wherein the second wiring includes contact region at the position corresponding to respective anode electrodes.

11. A display unit comprising:
a first insulating film;
a plurality of anode electrodes disposed on the first insulating film;
a second insulating film disposed on the plurality of anode electrodes;
a plurality of organic layers disposed on the plurality of anode electrodes;
a cathode electrode disposed on the plurality of organic layers;
an extraction electrode;
a first wiring disposed on the first insulating film and provided in a peripheral area of the plurality of anode electrodes; and
a second wiring disposed on the first insulating film and provided between two rows of the plurality of anode electrodes adjacent to one another,
wherein the cathode electrode is connected to the extraction electrode via the first wiring,
wherein at least a portion of the first wiring is covered with the cathode electrode and directly connected to the cathode electrode.

12. The display unit according to claim 11, wherein the plurality of organic layers are provided over the two rows of the plurality of anode electrodes.

13. The display unit according to claim 12, wherein the plurality of organic layers have a stripe shape.

14. The display unit according to claim 12, wherein the plurality of organic layers are continuously provided over the two or more lines of the anode electrodes.

15. The display unit according to claim 12, wherein the plurality of organic layers have a notch part at a portion corresponding to the contact region.

16. The display unit according to claim 15, wherein the second wiring is connected to the cathode electrode at the contact region.

17. The display unit according to claim 16, wherein the second wiring is connected to the first wiring.

18. The display unit according to claim 11, wherein the cathode electrode is made of metal including at least one of silver (Ag), aluminum (Al), magnesium (Mg), calcium (Ca), and sodium (Na).

19. The display unit according to claim 11, further comprising a protective film disposed on the cathode electrode.

20. The display unit according to claim 19, wherein the protective film has a thickness from about 500 nm to about 10,000 nm.

21. The display unit according to claim 19, wherein the protective film includes at least one of silicon oxide (SiO2) and silicon nitride (SiN).

22. The display unit according to claim 19, wherein the second wiring includes contact region at the position corresponding to respective anode electrodes.

23. A display unit comprising:
a first insulating film;
a plurality of anode electrodes disposed on the first insulating film;
a second insulating film disposed on the plurality of anode electrodes;
a plurality of organic layers disposed on the plurality of anode electrodes;
a cathode electrode disposed on the plurality of organic layers;
an extraction electrode;
a first wiring disposed on the first insulating film and provided in a peripheral area of the plurality of anode electrodes; and
a second wiring disposed on the first insulating film and provided between two rows of the plurality of anode electrodes adjacent to one another,
wherein the cathode electrode is connected to the extraction electrode via the first wiring,
wherein the first wiring surrounding the plurality of anode electrodes in the peripheral area of the display unit.

* * * * *